US010217742B2

(12) United States Patent
Oh et al.

(10) Patent No.: US 10,217,742 B2
(45) Date of Patent: Feb. 26, 2019

(54) SEMICONDUCTOR DEVICE HAVING DUMMY ACTIVE FIN PATTERNS

(71) Applicant: SAMSUNG ELECTRONICS CO., LTD., Suwon-si, Gyeonggi-do (KR)

(72) Inventors: In Wook Oh, Suwon-si (KR); Jae Seok Yang, Hwaseong-si (KR); Jong Hyun Lee, Suwon-si (KR); Hyun Jae Lee, Seoul (KR); Sung Wook Hwang, Gyeongsangbuk-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/902,025

(22) Filed: Feb. 22, 2018

(65) Prior Publication Data

US 2018/0182758 A1 Jun. 28, 2018

Related U.S. Application Data

(62) Division of application No. 15/372,840, filed on Dec. 8, 2016, now Pat. No. 9,929,156.

(30) Foreign Application Priority Data

Apr. 5, 2016 (KR) .................. 10-2016-0041563

(51) Int. Cl.
| | |
|---|---|
| H01L 27/08 | (2006.01) |
| H01L 27/02 | (2006.01) |
| H01L 23/52 | (2006.01) |
| G06F 17/50 | (2006.01) |
| H01L 27/088 | (2006.01) |
| H01L 23/528 | (2006.01) |

(52) U.S. Cl.
CPC ...... *H01L 27/0886* (2013.01); *G06F 17/5072* (2013.01); *H01L 23/528* (2013.01); *H01L 27/0207* (2013.01)

(58) Field of Classification Search
CPC ............ H01L 27/0886; H01L 27/0207; H01L 23/528; G06F 17/5072
See application file for complete search history.

(56) References Cited

U.S. PATENT DOCUMENTS

| 6,054,872 A | 4/2000 | Fudanuki et al. |
| 6,872,990 B1 | 3/2005 | Kang |
| 8,546,851 B2 | 10/2013 | Furuta et al. |

(Continued)

FOREIGN PATENT DOCUMENTS

| JP | 11-234109 A | 8/1999 |
| JP | 2007-081270 A | 3/2007 |

(Continued)

*Primary Examiner* — Ida M Soward
(74) *Attorney, Agent, or Firm* — Lee & Morse P.C.

(57) ABSTRACT

A semiconductor device includes circuit active fin lines and circuit gate lines intersecting each other in a circuit active region, dummy active fin lines and dummy gate lines intersecting each other in a dummy active region, the active fin lines and the dummy active fin lines having same width and pitch, and the circuit gate lines and the dummy gate lines having same width and pitch, wherein at least some of the dummy active fin lines are aligned with and collinear with respective circuit active fin lines, and at least some of the dummy gate lines are aligned with and collinear with respective circuit gate lines.

10 Claims, 32 Drawing Sheets

(56) References Cited

U.S. PATENT DOCUMENTS

| | | | |
|---|---|---|---|
| 8,603,893 B1 * | 12/2013 | Wei | H01L 21/76229 257/E21.546 |
| 8,697,515 B2 | 4/2014 | Yin et al. | |
| 8,739,104 B1 | 5/2014 | Penzes et al. | |
| 8,791,507 B2 | 7/2014 | Nakanishi et al. | |
| 8,802,510 B2 * | 8/2014 | Chang | H01L 21/3086 438/151 |
| 8,822,320 B2 * | 9/2014 | Cheng | H01L 21/3086 257/288 |
| 8,869,079 B2 | 10/2014 | Misaka et al. | |
| 8,928,110 B2 | 1/2015 | Lien et al. | |
| 8,941,156 B2 | 1/2015 | Bergendahl et al. | |
| 8,946,792 B2 | 2/2015 | Cheng et al. | |
| 9,026,975 B2 * | 5/2015 | Song | G06F 17/5081 703/14 |
| 9,047,433 B2 | 6/2015 | Yang et al. | |
| 9,105,467 B2 | 8/2015 | Lee et al. | |
| 9,123,810 B2 | 9/2015 | Hong et al. | |
| 9,147,029 B2 | 9/2015 | Ke et al. | |
| 9,269,629 B2 | 2/2016 | Cheng et al. | |
| 9,299,842 B2 | 3/2016 | Baek | |
| 9,373,719 B2 * | 6/2016 | Hong | H01L 29/6681 |
| 9,379,027 B2 * | 6/2016 | Kim | H01L 27/11807 |
| 9,379,236 B2 | 6/2016 | Ponoth et al. | |
| 9,385,048 B2 | 7/2016 | Hong et al. | |
| 9,397,099 B1 | 7/2016 | Huang | |
| 9,460,259 B2 * | 10/2016 | Baek | G06F 17/5072 |
| 9,543,155 B2 | 1/2017 | Lee et al. | |
| 9,647,066 B2 | 5/2017 | Lu et al. | |
| 9,647,113 B2 | 5/2017 | Cheng et al. | |
| 9,653,466 B2 * | 5/2017 | Yang | H01L 27/0886 |
| 9,698,047 B2 * | 7/2017 | Hung | H01L 21/768 |
| 9,741,829 B2 | 8/2017 | Peng et al. | |
| 9,805,987 B2 * | 10/2017 | Basker | H01L 21/823807 |
| 2014/0097493 A1 | 4/2014 | Baek et al. | |
| 2015/0061040 A1 | 3/2015 | Bergendahl et al. | |
| 2015/0206744 A1 * | 7/2015 | Cheng | H01L 21/76224 438/152 |
| 2016/0099177 A1 | 4/2016 | Youn et al. | |
| 2016/0117431 A1 * | 4/2016 | Kim | G06F 17/5072 716/119 |
| 2016/0155741 A1 * | 6/2016 | Yoo | H01L 27/0924 257/369 |
| 2016/0190138 A1 * | 6/2016 | Shimbo | H01L 27/0207 257/369 |
| 2016/0190141 A1 | 6/2016 | Lee et al. | |
| 2016/0336429 A1 | 11/2016 | Peng et al. | |
| 2017/0033101 A1 * | 2/2017 | Sharma | H01L 27/0886 |
| 2017/0140992 A1 | 5/2017 | Chang et al. | |
| 2017/0213901 A1 | 7/2017 | Ho et al. | |
| 2018/0158841 A1 * | 6/2018 | Glass | H01L 27/1211 |

FOREIGN PATENT DOCUMENTS

| | | |
|---|---|---|
| JP | 2011-222747 A | 11/2011 |
| KR | 10-2008-0062727 A | 7/2008 |
| KR | 10-2009-0071045 A | 7/2009 |

* cited by examiner

III - III'

IV - IV'

SEMICONDUCTOR DEVICE HAVING DUMMY ACTIVE FIN PATTERNS

CROSS-REFERENCE TO RELATED APPLICATIONS

This is a divisional application based on pending application Ser. No. 15/372,840, filed Dec. 8, 2016, the entire contents of which is hereby incorporated by reference.

Korean Patent Application No. 10-2016-0041563, filed on Apr. 5, 2016, in the Korean Intellectual Property Office, and entitled: "Layout Method and Semiconductor Device," is incorporated by reference herein in its entirety.

BACKGROUND

1. Field

Example embodiments relate to a layout method, a method of manufacturing a semiconductor device using the same, a semiconductor device thereof, and an electronic system selecting the same.

2. Description of the Related Art

As semiconductor devices tend to be highly integrated, transistors have gradually been miniaturized, and short channel effects of transistors are further increased. In order to suppress short channel effects, a fin field effect transistor (FinFET) structure has been proposed. As miniaturized transistors having a FinFET structure are manufactured, unexpected defects may occur, thereby reducing yields and productivity.

SUMMARY

In accordance with example embodiments, a layout method may include forming circuit active fin lines and circuit gate lines to intersect the circuit active fin lines in a layout region, identifying a vacant region in the layout region, setting a grid map in the vacant region using a grid unit, and forming dummy active fin lines and dummy gate lines within the grid map using a cell unit, wherein the grid unit has a quadrangular shape having first and second sides opposing each other and third and fourth sides opposing each other, and wherein the cell unit includes an active fin unit connecting middle portions of the first and second sides of the grid unit to each other, and a gate unit connecting middle portions of the third and fourth sides of the grid unit to each other and intersecting the active fin unit.

In accordance with other example embodiments, a layout method may include forming first circuit active fin lines and first circuit gate lines intersecting the first circuit active fin lines in a layout region, the first circuit active fin lines being formed at a first pitch and the first circuit gate lines being formed at a second pitch, identifying a vacant region in the first layout region, setting a grid map in the vacant region, and forming dummy active fin lines and dummy gate lines in the vacant region in which the grid map is set, wherein setting the grid map includes forming a plurality of grid units, and arranging the plurality of grid units in the vacant region, wherein forming the dummy active fin lines and the dummy gate lines includes forming a plurality of cell units by interposing a cell unit between the plurality of grid units, wherein the cell unit includes an active fin unit and a gate unit intersecting each other; and wherein an intersection region of the active fin unit and the gate unit of the cell unit is disposed in a central portion of the grid unit.

In accordance with other example embodiments, a semiconductor device may include a circuit region and a dummy region. The dummy region includes a first dummy region and a second dummy region, and the circuit region includes a first circuit region opposing the first dummy region and a second circuit region spaced apart from the first dummy region. Circuit active fin patterns are disposed in the circuit region. Dummy active fin patterns are disposed in the dummy region and are disposed at the same pitch as a pitch of the circuit active fin patterns. Circuit gate lines are disposed in the circuit region. Dummy gate lines are disposed in the dummy region and are disposed at the same pitch as a pitch of the circuit gate lines. A density of the dummy active fin patterns disposed in the first dummy region is different from a density of the circuit active fin patterns disposed in the first circuit region, and a density of the dummy active fin patterns disposed in the second dummy region is different from a density of the dummy active fin patterns disposed in the first dummy region.

In accordance with other example embodiments, a semiconductor device may include a circuit region and a dummy region adjacent to each other. Circuit active fin patterns having a linear shape extended in a first direction may be disposed in the circuit region. Dummy active fin patterns having a linear shape extended in the first direction may be disposed in the dummy region. The dummy active fin patterns include first-side fin patterns having end portions opposing end portions of the circuit active fin patterns. Circuit gate lines intersecting the circuit active fin patterns may be disposed in the circuit region. Dummy gate lines having end portions opposing end portions of the circuit gate lines may be disposed in the dummy region. Sides of the circuit active fin patterns and sides of the first-side fin patterns are aligned with each other, and sides of the circuit gate lines and sides of the dummy gate lines are aligned with each other.

In accordance with other example embodiments, a semiconductor device may include circuit active fin lines and circuit gate lines intersecting each other in a circuit active region, dummy active fin lines and dummy gate lines intersecting each other in a dummy active region, the active fin lines and the dummy active fin lines having same width and pitch, and the circuit gate lines and the dummy gate lines having same width and pitch, wherein at least some of the dummy active fin lines are aligned with and collinear with respective active fin lines, and at least some of the dummy gate lines are aligned with and collinear with respective circuit gate lines.

BRIEF DESCRIPTION OF DRAWINGS

Features will become apparent to those of ordinary skill in the art by describing in detail exemplary embodiments with reference to the attached drawings, in which.

DETAILED DESCRIPTION

With reference to FIGS. 1 to 12, semiconductor device layout methods according to example embodiments, layouts formed using the layout methods, regions in which the layouts may be disposed, and target patterns for the formation of the layouts will be described below.

Figure 10A:
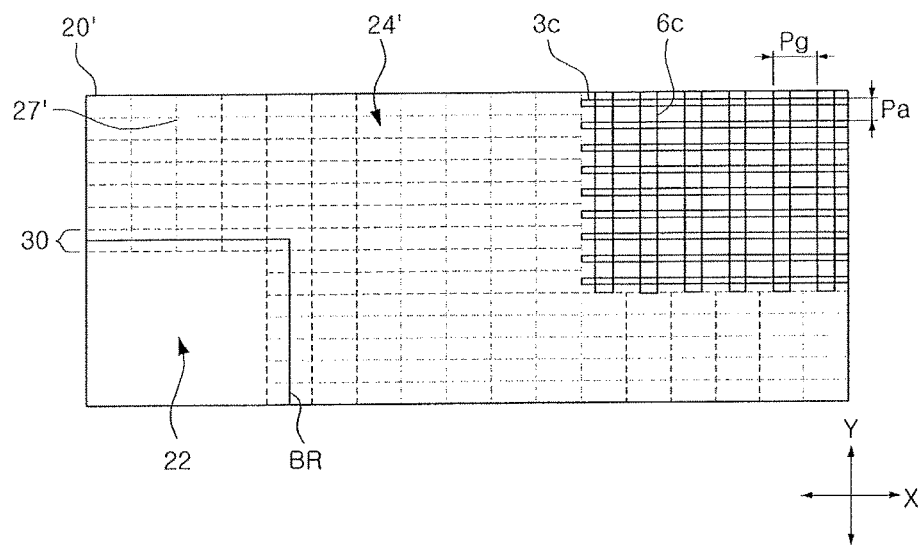
FIGS. 10A to 10C illustrate plan views of an example of a semiconductor device layout method according to an example embodiment.
Figure 10B:
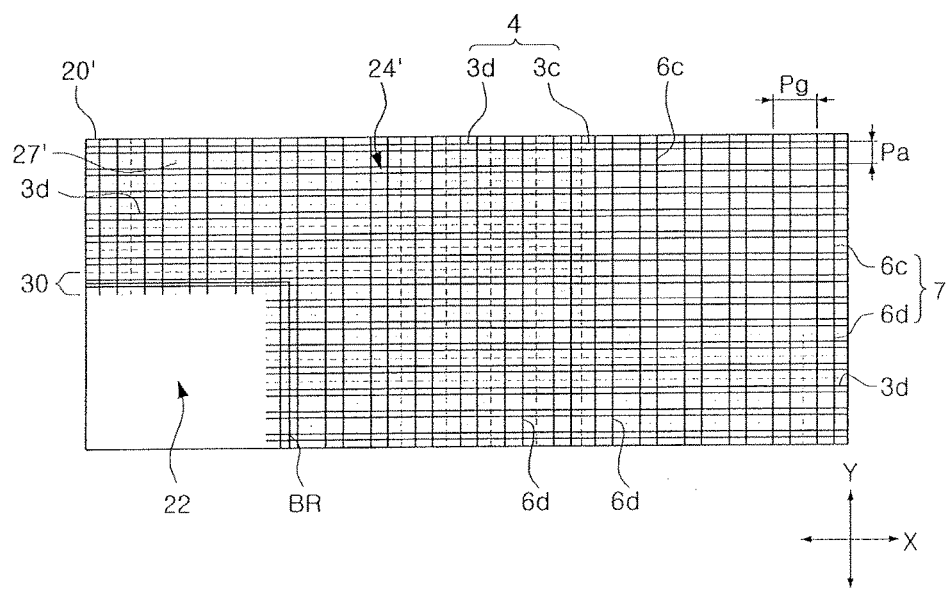
Figure 10C:
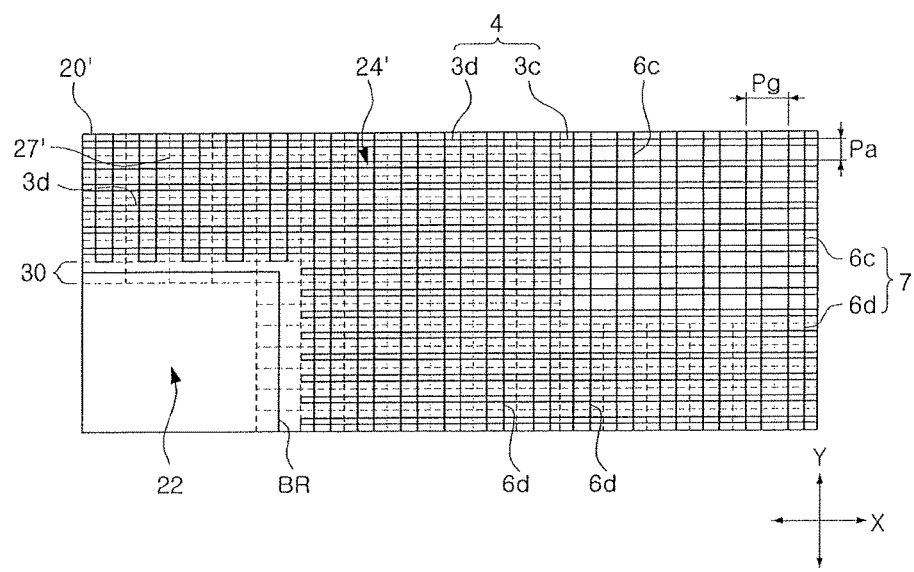
Figure 11A:
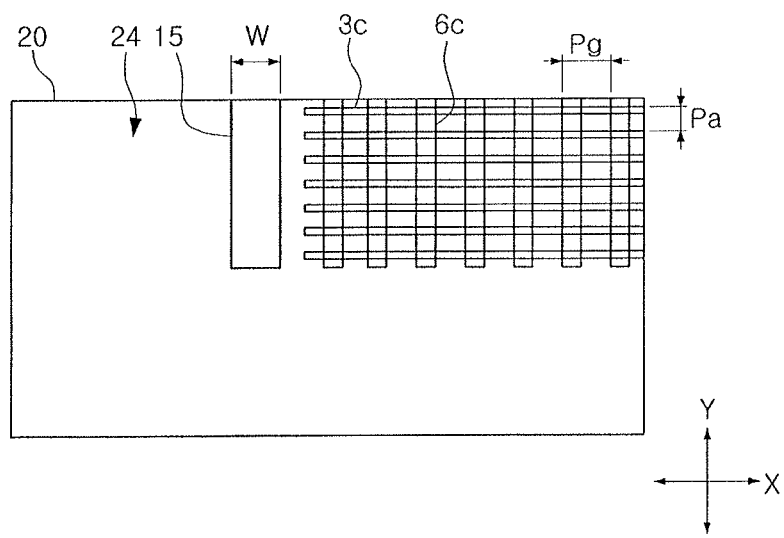
FIGS. 11A to 11D illustrate plan views of an example of a semiconductor device layout method according to an example embodiment.
Figure 11B:
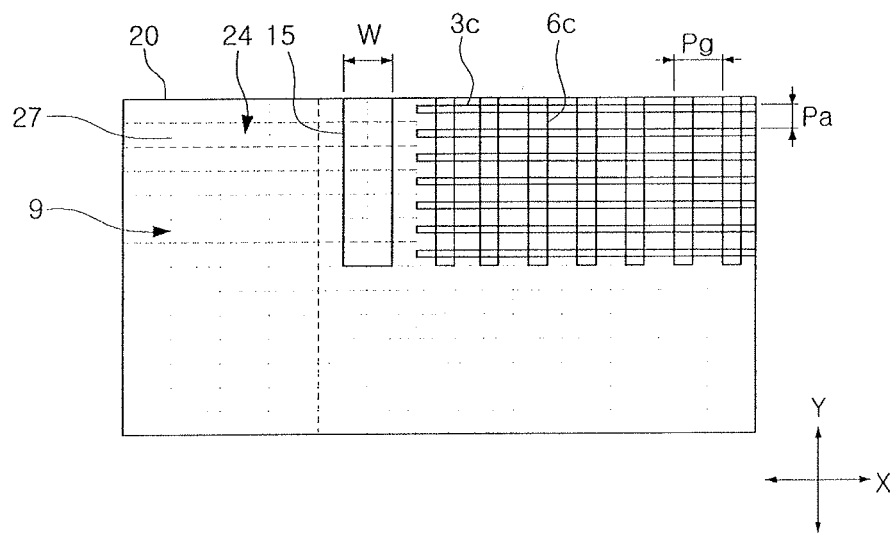
Figure 11C:
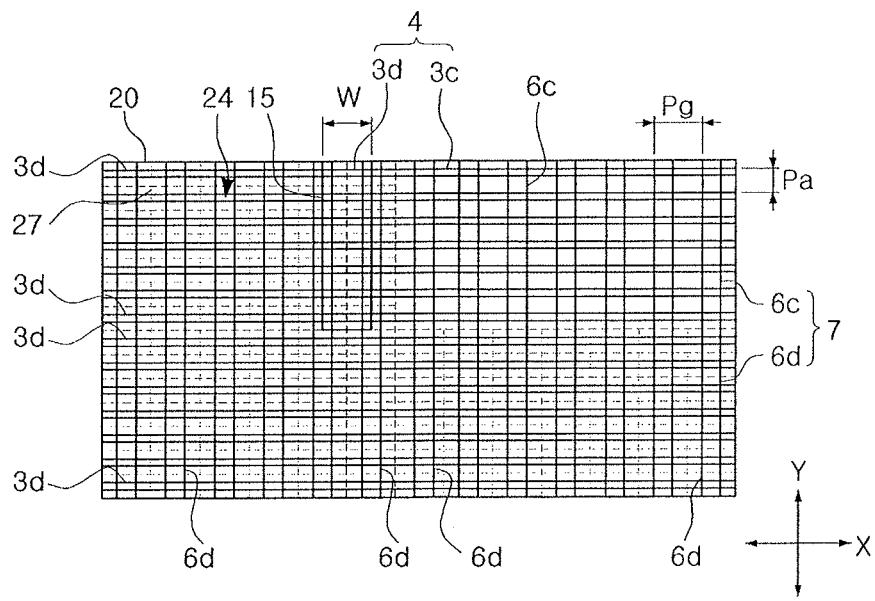
Figure 11D:
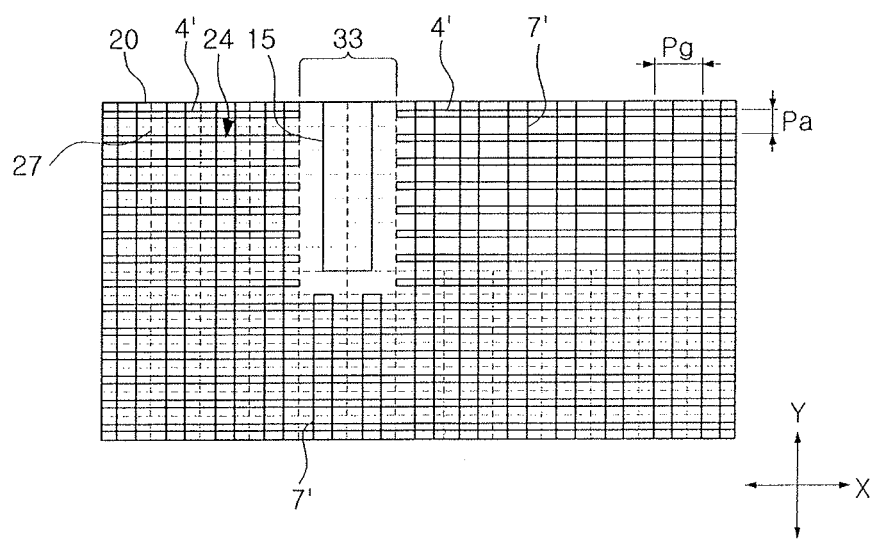
Figure 12:
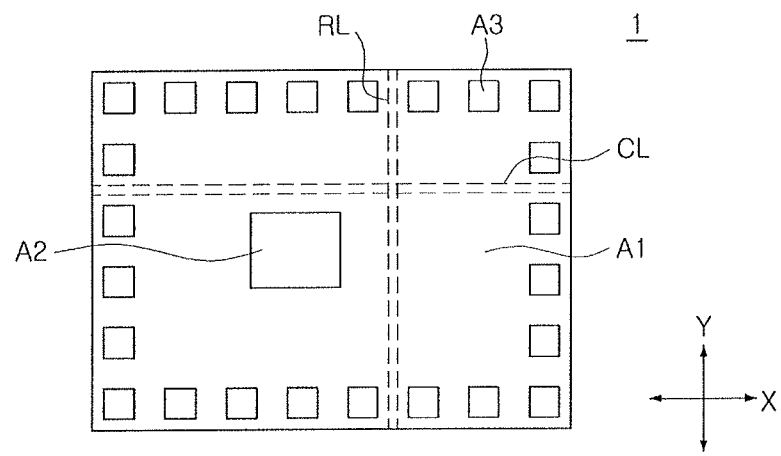
FIG. 12 illustrates a conceptual view of a semiconductor device according to example embodiments.

In FIGS. 1 to 12, FIGS. 1 to 9 are drawings illustrating semiconductor device layout methods according to example embodiments and layouts formed using the layout methods. FIGS. 10A to 10C are drawings illustrating regions in which layouts formed using semiconductor device layout methods according to example embodiments are disposed. FIGS. 11A to 12 are drawings illustrating an example of target patterns targeted at layouts in semiconductor device layout methods according to example embodiments.

First, a semiconductor device layout method according to an example embodiment will be described with reference to FIGS. 1 to 4B. In FIGS. 1 to 4B, FIG. 1 is a flowchart illustrating an example of a semiconductor device layout method according to an example embodiment, FIGS. 2A to 2D are plan views illustrating an example of a semiconductor device layout method according to an example embodiment, and FIGS. 3A to 4B are plan views illustrating an example of a semiconductor device layout method according to an example embodiment.

Figure 1:
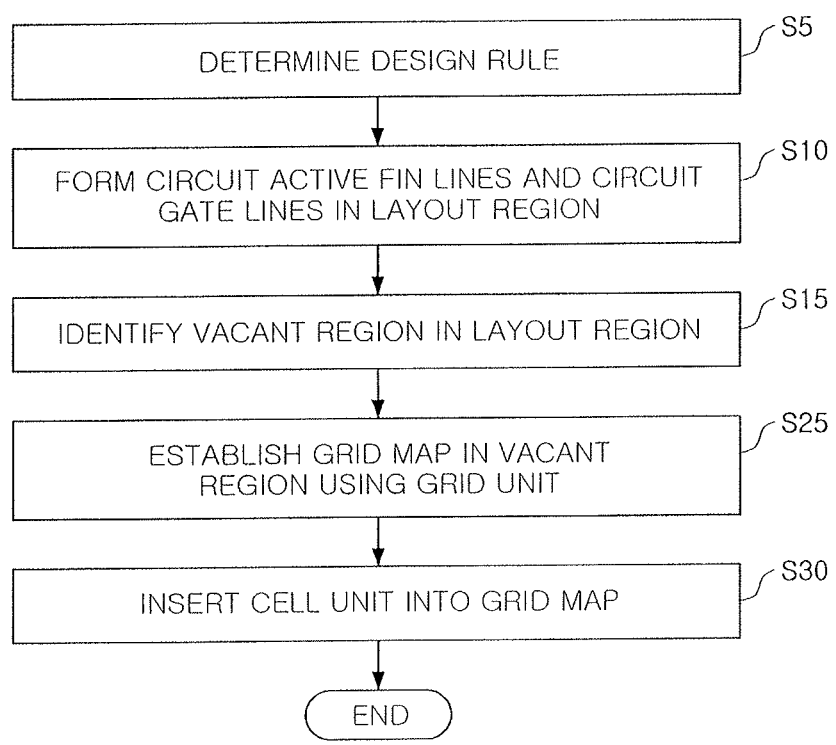
FIG. 1 illustrates a flowchart of an example of a semiconductor device layout method according to an example embodiment.
Figure 2A:
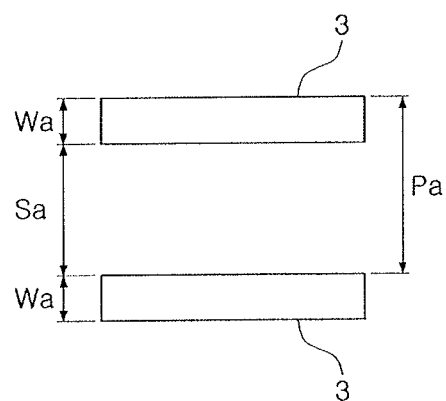
FIGS. 2A to 2D illustrate plan views of stages in an example of a semiconductor device layout method according to an example embodiment.
Figure 2B:
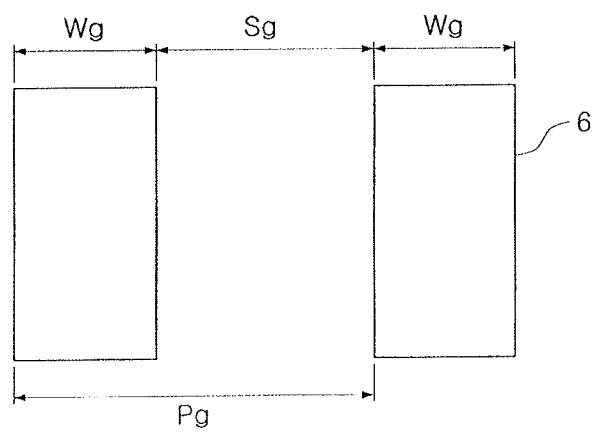

With reference to FIGS. 1 to 2B, a design rule may be determined in operation S5. Determining the design rule may include determining active fin units 3 of a first pitch Pa and gate units 6 of a second pitch Pg.

In detail, the determination of the design rule may include determining a first width Wa of each active fin unit 3 and a first distance Sa between adjacent active fin units 3, and determining a second distance Sg between adjacent gate units 6. That is, each of the active fin units 3 may have a first width Wa, and the active fin units 3 may be spaced apart from each other by the first distance Sa. Each of the gate units 6 may have a second width Wg, and the gate units 6 may be spaced apart from each other by a second distance Sg.

The first pitch Pa of the active fin units 3 may be a sum of the first width Wa of the active fin unit 3 and the first distance Sa between the active fin units 3, i.e., Pa=Wa+Sa. The second pitch Pg of the gate units 6 may be a sum of the second width Wg of the gate unit 6 and the second distance Sg between the gate units 6, i.e., Pg=Wg+Sg.

In an example, the active fin units 3 and the gate units 6 may be constituent elements configuring a transistor having a FinFET structure. For example, the active fin units 3 may be active fins in which a channel region of a transistor having a FinFET structure may be formed, and the gate units 6 may be gate electrodes of a transistor having a FinFET structure.

Figure 2C:
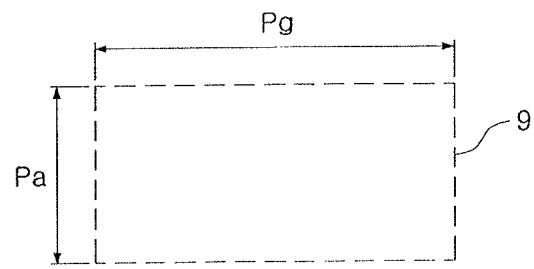

With reference to FIGS. 1 to 2C, the determination of the design rule may further include determining, e.g., marking, a grid unit 9 using the first pitch Pa and the second pitch Pg.

The grid unit 9 may have a quadrangular shape. A transversal length of the grid unit 9 may be determined by the second pitch Pg of the gate units 6, and a longitudinal length of the grid unit 9 may be determined by the first pitch Pa of the active fin units 3. Thus, the transversal length of the grid unit 9 may be the same as the second pitch Pg, and the longitudinal length of the grid unit 9 may be the same as the first pitch Pa.

Figure 2D:
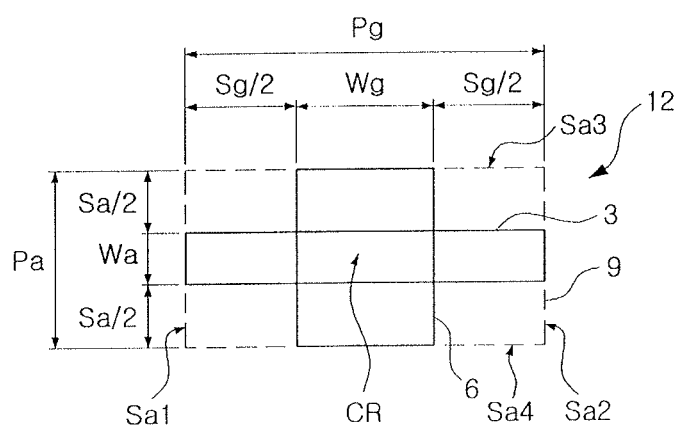

With reference to FIGS. 1 to 2D, the determination of the design rule may further include determining a cell unit 12.

Determining the cell unit 12 may include disposing the active fin unit 3 and the gate unit 6 in the grid unit 9. The cell unit 12 may include the active fin unit 3 and the gate unit 6 intersecting each other in the grid unit 9.

In the cell unit 12, the active fin unit 3 may have the first width Wa and a first length Pg having the same size as the second pitch Pg. In the cell unit 12, the gate unit 6 may have the second width Wg and a second length Pa having the same size as the first pitch Pa. Thus, a length of the active fin unit 3 may be the same as the second pitch Pg, and a length of the gate unit 6 may be the same as the first pitch Pa.

The active fin unit 3 of the cell unit 12 may be disposed to connect middle portions of two sides of the grid unit 9, and the gate unit 6 of the cell unit 12 may be disposed to connect middle portions of a lower surface of the grid unit 9 and an upper surface of the grid unit 9.

The active fin unit 3 and the gate unit 6 of the cell unit 12 may be intersected with each other in the grid unit 9. An intersection region CR of the active fin unit 3 and the gate unit 6 in the cell unit 12 may be a central portion of the grid unit 9.

The grid unit 9 may have a quadrangular shape with first and second sides Sa1 and Sa2 opposing each other, and third and fourth sides Sa3 and Sa4 opposing each other. The cell unit 12 may include the active fin unit 3 connecting middle portions of the first and second sides Sa1 and Sa2 of the grid unit 9 to each other, and the gate unit 6 intersecting the active fin unit 3 while connecting middle portions of the third and fourth sides Sa3 and Sa4 of the grid unit 9 to each other.

In the cell unit 12, the active fin unit 3 may be extended from the intersection region CR with respect to the gate unit 6 by an amount equal to half (Sg/2) of the second distance Sg. In the cell unit 12, the gate unit 6 may be extended from the intersection region CR with respect to the active fin unit 3 by an amount equal to half (Sa/2) of the first distance Sa.

With reference to FIGS. 1 to 3A, circuit active fin lines 3c and circuit gate lines 6c may be formed in a layout region 20, in operation S10. The layout region 20 may be provided as a display of a computer.

In an example, the layout region 20 may be a region in which patterns formed at the same pitch on a same plane and a same layer are disposed. For example, the layout region 20 may be a region in which active fins having the same pitch and gate lines having the same pitch are formed.

The circuit active fin lines 3c may be formed using the active fin units 3 formed at the first pitch Pa. Thus, the circuit active fin lines 3c may be formed at the first pitch Pa. The circuit active fin lines 3c may be formed using the first pitch Pa, the first width Wa, and the first distance Sa determined by the design rule. The circuit active fin lines 3c may be formed to have the first width Wa equal to that of the active fin units 3. A distance between the circuit active fin lines 3c may be the same as the first distance Sa between the active fin units 3.

The circuit gate lines 6c may be formed using the gate units 6 formed at the second pitch Pg. Thus, the circuit gate lines 6c may be formed at the second pitch Pg. The circuit gate lines 6c may be formed using the second pitch Pg, the second width Wg, and the second distance Sg determined by the design rule. The circuit gate lines 6c may be formed to have the second width Wg equal to that of the gate units 6. A distance between the circuit gate lines 6c may be the same as the second distance Sg between the gate units 6.

The circuit active fin lines 3c may have a linear shape extended in a first direction X, and the circuit gate lines 6c may have a linear shape extended in a second direction Y perpendicular to the first direction X. In an example, the circuit active fin lines 3c and the circuit gate lines 6c may intersect each other to form intersection regions CR as illustrated in FIG. 2D. End portions of the circuit active fin lines 3c may extend from the intersection regions CR by an amount equal to half (Sg/2) of the second distance Sg described above with reference to FIG. 2D in the first direction X. End portions of the circuit gate lines 6c may extend from the intersection regions CR by an amount equal to half (Sa/2) of the first distance Sa described above with reference to FIG. 2D, in the second direction Y.

In an example, the circuit active fin lines 3c and the circuit gate lines 6c may be formed simultaneously with each other, but are not limited thereto. For example, the circuit gate lines 6c may be formed after the circuit active fin lines 3c are formed, or the circuit active fin lines 3c may be formed after the circuit gate lines 6c are formed.

An empty space or a vacant region 24 in the layout region 20 may be identified in operation S15. Identifying the vacant region 24 may be undertaken by determining a region in which the circuit active fin lines 3c and the circuit gate lines 6c are not formed to be a vacant area.

With reference to FIGS. 1 to 3B, a grid map 27 may be established, e.g., defined, in the vacant region 24 using the grid unit 9 (see FIG. 2C), in operation S25.

In the case of the grid unit 9 (FIG. 2C), a plurality of grid units 9 may be disposed, e.g., defined, in the vacant region 24 in the first direction X and the second direction Y. The grid units 9 in the grid map 27 may be disposed, e.g., marked, to be aligned with end portions of the circuit active fin lines 3c and the circuit gate lines 6c. For example, end portions of the circuit active fin lines 3c may be aligned with middle portions of the grid units 9 in the first direction X in the grid map 27, and end portions of the circuit gate lines 6c may be aligned with middle portions of the grid units 9 in the first direction X in the grid map 27.

Establishing the grid map 27 in the vacant region 24 using the grid units 9 (FIG. 2C) may include forming, e.g., marking, the grid units 9 from a vacant region adjacent to the end portions of the circuit active fin lines 3c or the end portions of the circuit gate lines 6c. For example, the establishment of the grid map 27 in the vacant region 24 using the grid units 9 (FIG. 2C) may include first forming grid units 9 in contact with end portions of the circuit active fin lines 3c and the circuit gate lines 6c, and based on the grid units 9 formed as above, forming grid units 9 in a remaining vacant region.

Figure 3A:
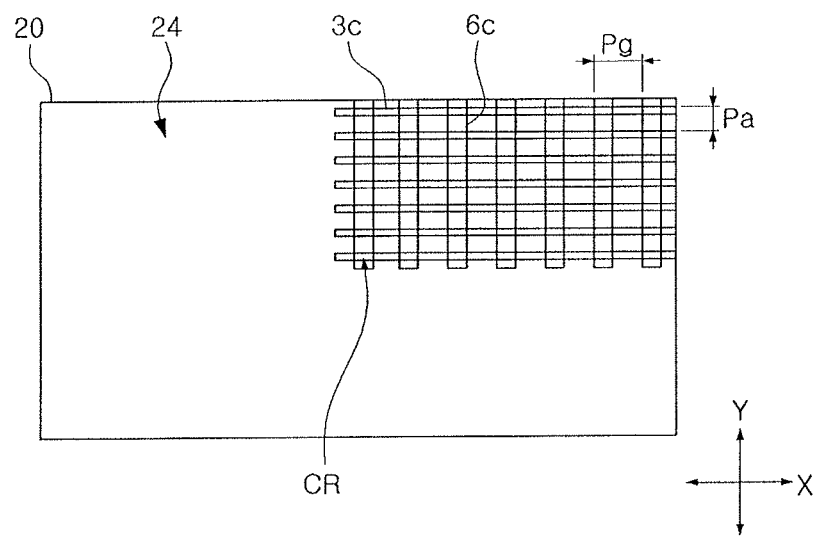
FIGS. 3A to 4B illustrate plan views of an example of a semiconductor device layout method according to an example embodiment.

As illustrated in FIG. 3A, the end portions of the circuit active fin lines 3c may be extended from the intersection regions CR by an amount equal to half (Sg/2) of the second distance Sg, and the end portions of the circuit gate lines 6c may be extended from the intersection regions CR by an amount equal to half (Sa/2) of the first distance Sa described above with reference to FIG. 2D. Thus, the grid units 9 in contact with the end portions of the circuit active fin lines 3c and the end portions of the circuit gate lines 6c may first be formed, and then, based on the grid units 9 formed as above, grid units 9 may be formed in the remaining vacant region, thereby forming the grid units 9 in the vacant region 24 without an idle vacant region.

With reference to FIG. 1, FIGS. 2A to 2D, FIG. 3C, FIG. 4A and FIG. 4B, inserting a cell unit 12 (see FIG. 2D) into the grid map 27 may be performed in operation S30. That is, the cell units 12 (FIG. 2D) may be interposed among the grid units 9 provided in the grid map 27, to form dummy active fin lines 3d and dummy gate lines 6d, e.g., each cell unit may be formed in a respective grid unit 9 of the grid map 27.

The dummy active fin lines 3d may have a linear shape extended in the first direction X, and the dummy gate lines 6d may have a linear shape extended in the second direction Y. The dummy active fin lines 3d may be formed by allowing the active fin units 3 (FIG. 2D) of the cell units 12 (FIG. 2D) to be continuously connected thereto, and the dummy gate lines 6d may be formed by allowing the gate units 6 (FIG. 2D) of the cell units 12 (FIG. 2D) to be continuously connected thereto.

The dummy active fin lines 3d may include first-side dummy active fin lines 3d_1 extended from the circuit active fin lines 3c and second side dummy active fin lines 3d_2 parallel to the circuit active fin lines 3c. For example, as illustrated in FIG. 3C, the first-side dummy active fin lines 3d_1 may be directly connected to and collinear with respective circuit active fin lines 3c to extend therefrom, and the second side dummy active fin lines 3d_2 may extend in parallel to the connected first-side dummy active fin lines 3d_1 and circuit active fin lines 3c, e.g., below the circuit active fin lines 3c in FIG. 3C.

The dummy gate lines 6d may include first-side dummy gate lines 6d_1 extended from the circuit gate lines 6c and second-side dummy gate lines 64_2 parallel to the circuit gate lines 6c. For example, as illustrated in FIG. 3C, the first-side dummy gate lines 64_1 may be directly connected to and collinear with respective circuit gate lines 6c to extend therefrom, and the second side dummy gate lines 6d_2 may extend in parallel to the connected first-side dummy gate lines 6d_1 and circuit gate lines 6c, e.g., on the left side of the circuit gate lines 6c in FIG. 3C The circuit active fin lines 3c and the dummy active fin lines 3d may form active fin lines 4 (FIG. 4A), and the circuit gate lines 6c and the dummy gate lines 6d may form gate lines 7 (FIG. 4B). The active fin lines 4 and the gate lines 7 may be discriminated, e.g., distinguished, from each other as different layers or different planar layers. For example, an active fin layout 20a configured of the active fin lines 4 illustrated in FIG. 4A, and a gate layout 20b configured of the gate lines 7 illustrated in FIG. 4B may be formed as separate layers.

Figure 4A:
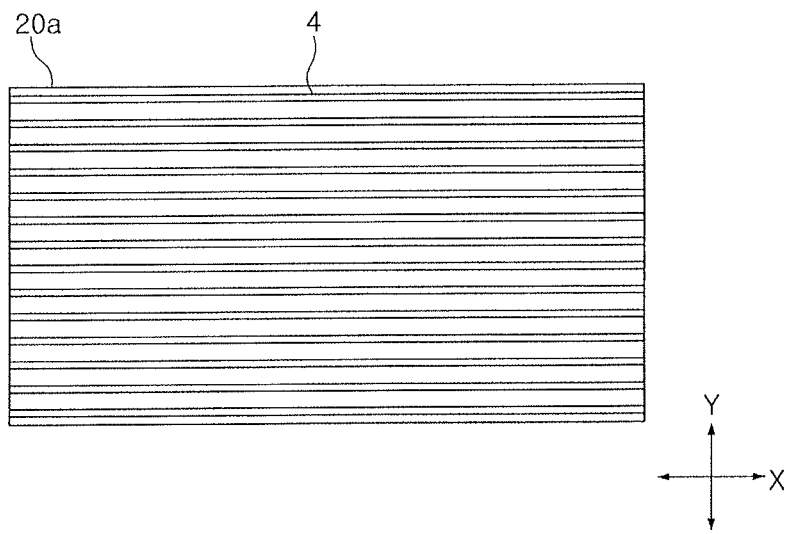

The active fin layout 20a configured of the active fin lines 4, as illustrated in FIG. 4A, may be used to manufacture a separate photomask, and the photomask may be used in a process of manufacturing a semiconductor device. The gate layout 20b configured of the gate lines 7, as illustrated in FIG. 4B, may be used to manufacture a separate photomask, and the photomask may be used in a process of manufacturing a semiconductor device. Thus, in the semiconductor device forming process, the active fin layout 20a configured of the active fin lines 4, as illustrated in FIG. 4A, and the gate layout 20b configured of the gate lines 7, as illustrated in FIG. 4B, may be used.

Figure 3B:
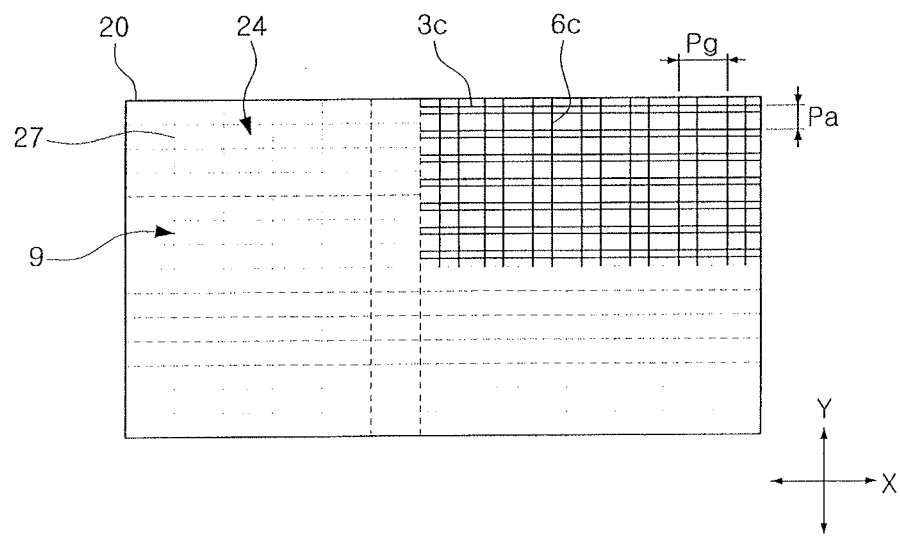
Figure 3C:
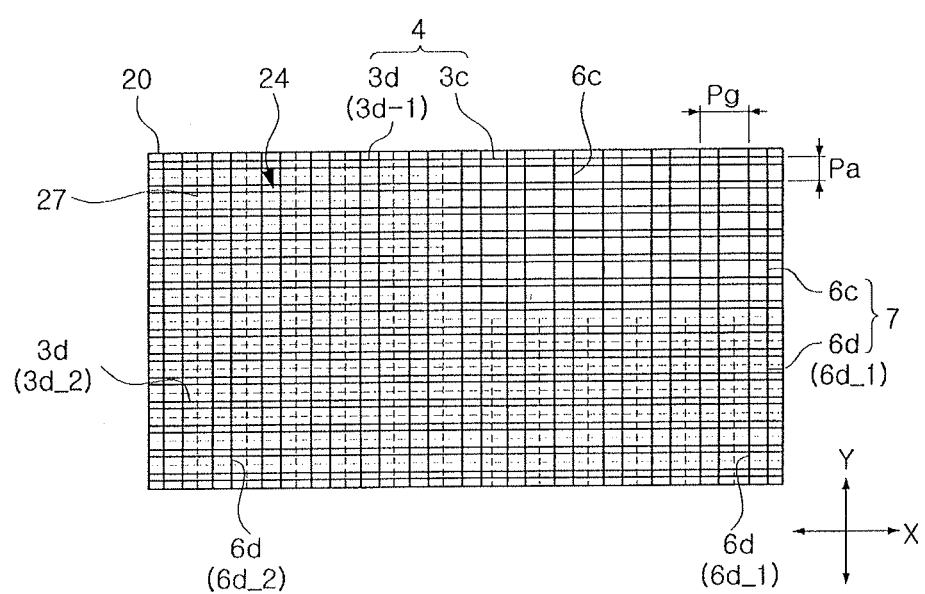
Figure 4B:
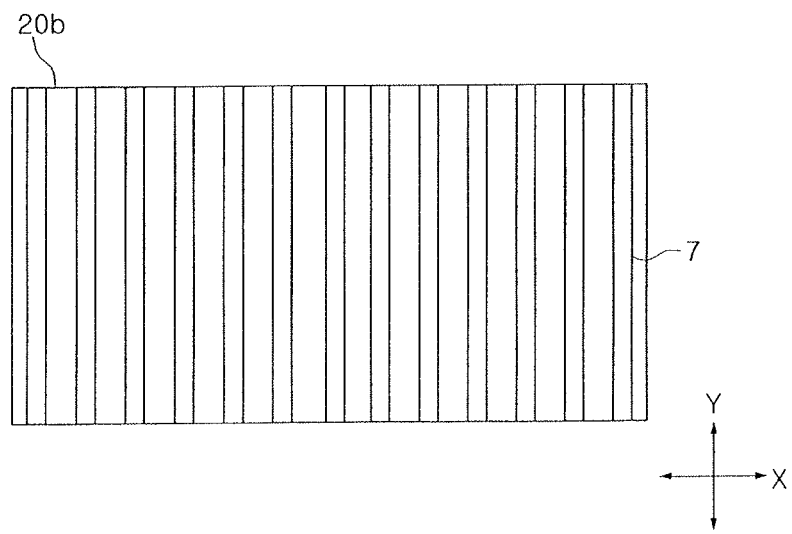

A first layout may be formed using a method as described above with reference to FIGS. 1 to 4B, and then, a second layout may be formed, e.g., on the structure illustrated in FIG. 3C. An example of the second layout will be described below with reference to FIGS. 5 to 6B.

Figure 5:
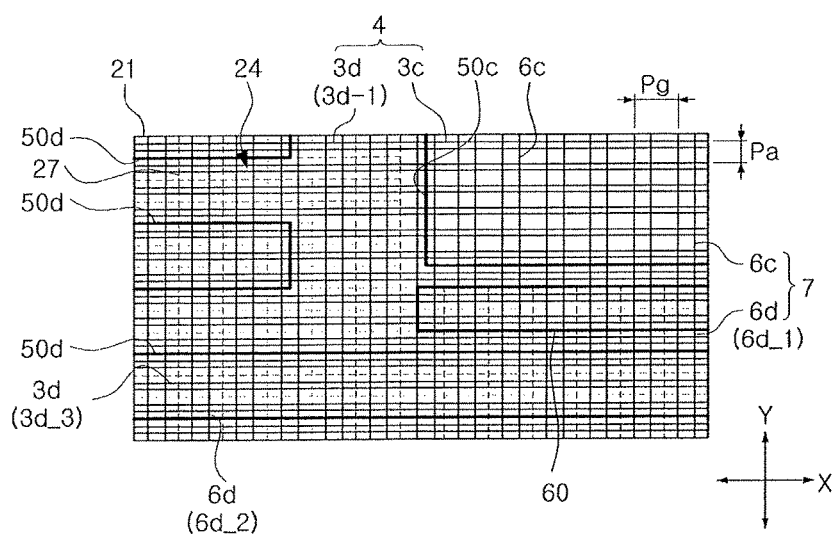
FIGS. 5, 6A and 6B illustrate plan views of another example of a semiconductor device layout method according to an example embodiment.
Figure 6A:
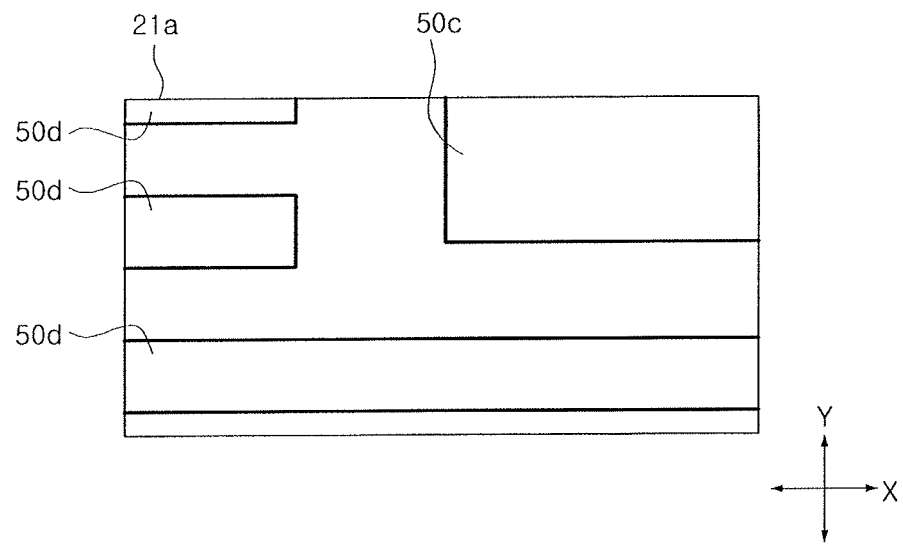
Figure 6B:
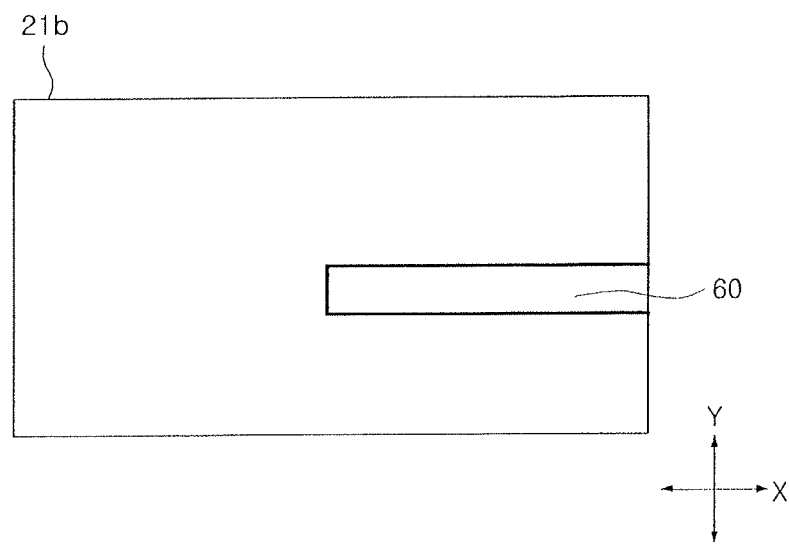

FIGS. 5, 6A, and 6B are plan views illustrating a method of forming a layout in which final patterns may be formed using the active fin layout 20a (FIG. 4A) configured of the active fin lines 4, as illustrated in FIG. 4A, and the gate layout 20b (FIG. 4B) configured of the gate lines 7, as illustrated in FIG. 4B. FIG. 5 depicts a layout region 21 including active layout patterns 50c and 50d and a gate layout pattern 60, as well as the active fin lines 4 and the gate lines 7 illustrated in FIG. 3C. FIG. 6A is a drawing of a layout 21a illustrating an example of the active layout patterns 50c and 50d, and FIG. 6B is a drawing of a layout 21b illustrating the gate layout pattern 60.

First, referring to FIGS. 3C, 5, 6A and 6B, the active layout patterns 50c and 50d, and the gate layout pattern 60 may be formed in the layout region 21, e.g., on the active fin lines 4 and gate lines 7.

The active layout patterns 50c and 50d may include the active layout pattern 50c overlapping the circuit active fin lines 3c of the active fin lines 4, and dummy active layout patterns 50d overlapping the dummy active pin lines 3d of the active fin lines 4 (FIG. 5 in view of FIG. 6A). The gate layout pattern 60 may be formed in such a manner that a portion of the gate lines 7 are cut (FIG. 5 in view of FIG. 6B). For example, the gate layout pattern 60 may be formed to open a distance between the dummy gate lines 6d and the circuit gate lines 6c.

The active layout patterns 50c and 50d and the gate layout pattern 60 may be discriminated, e.g., distinguished, from each other as different layers or different planar surfaces. For example, the layout 21a configured of the active layout patterns 50c and 50d, as illustrated in FIG. 6A, and the layout 21b configured of the gate layout pattern 60, as illustrated in FIG. 6B, may be formed as separate layers.

The layout 21a configured of the active layout patterns 50c and 50d, as illustrated in FIG. 6A, may be used for manufacturing a separate photomask, and this photomask may be used for a process in which a semiconductor device is formed. The layout 21b configured of the gate layout pattern 60, as illustrated in FIG. 6B, may be used for manufacturing a separate photomask, and this photomask may be used in a process in which a semiconductor device is formed. In an example, after the active fin lines 4 are formed using the layout 20a (FIG. 4A), the active fin lines 4 may be patterned using the active layout patterns 50c and 50d of the layout 21a (FIG. 6A), thereby forming final active fin patterns in a semiconductor device. In another example, after the gate lines 7 are formed using the layout 20b (FIG. 4B), the gate lines 7 may be patterned using the gate layout pattern 60 of the layout 21b (FIG. 6B) to form final gate lines to be used as gate electrodes in a semiconductor device.

Figure 7:
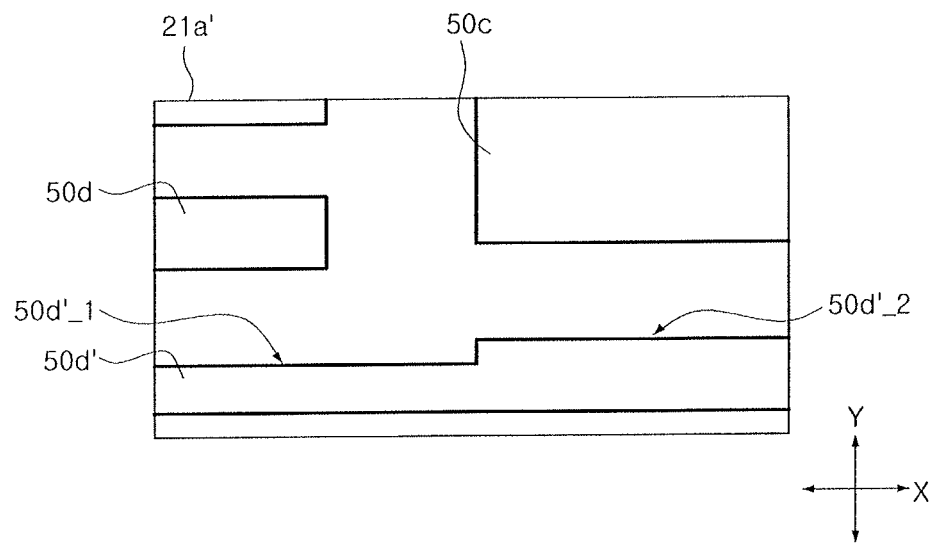
FIG. 7 illustrates a plan view of another example of a semiconductor device layout method according to an example embodiment.

In FIG. 6A, the dummy active layout pattern 50d may have a linear shape extended in the first direction X, but is not limited thereto. Examples of shapes of the dummy active layout pattern 50d will be described with reference to FIGS. 7 and 8. FIG. 7 illustrates a layout 21a' illustrating a modified example 50d' of the dummy active layout pattern, and FIG. 8 illustrates a layout 21a" illustrating another modified example 50d" of the dummy active layout pattern.

With reference to FIG. 7, the dummy active layout pattern 50d' may have a form extended lengthwise in the first direction X. The dummy active layout pattern 50d' may include first and second portions 50d'_1 and 50d'_2 having different widths along the Y direction, while having a form extended lengthwise in the first direction X. For example, the first portion 50d'_1 may have a width smaller than the second portion 50d'_2, but is not limited thereto. For example, a portion of the dummy active layout pattern 50d' opposing, e.g., facing, a portion of the circuit active layout pattern 50c having a relatively large planar area may be formed to have a relatively narrow width, and a portion of the dummy active layout pattern 50d' opposing, e.g., facing, a portion of the circuit active layout pattern 50c having a relatively small planar area may be formed to have a relatively great width.

In detail, the dummy active layout pattern 50d' may have two sides parallel to each other in the first direction X, and one of the two sides may be indented. For example, a first side of the dummy active layout pattern 50d' opposing, e.g., facing, the circuit active layout pattern 50c may be curved, e.g., indented, and a second side of the dummy active layout pattern 50d' opposing the first side may be linear, e.g., straight, but are not limited thereto. For example, both of the first and second sides of the dummy active layout pattern 50d' may be curved.

Figure 8:
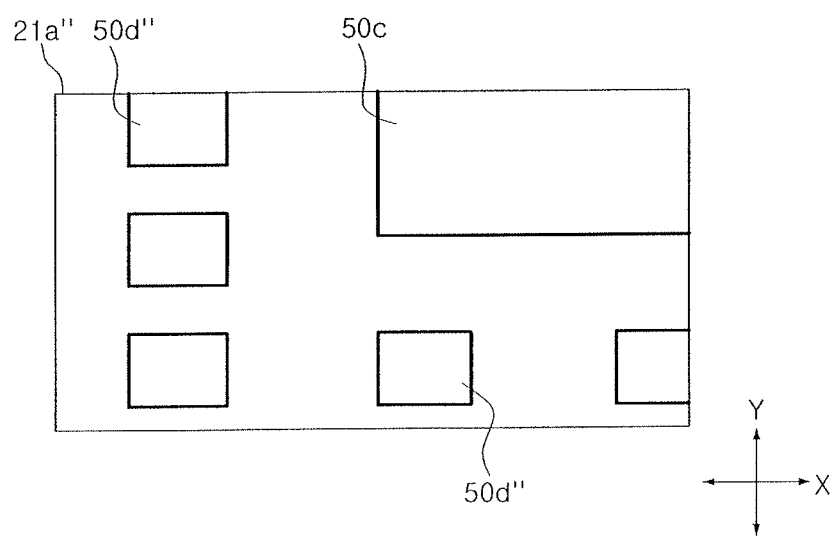
FIG. 8 illustrates a plan view of another example of a semiconductor device layout method according to an example embodiment.

With reference to FIG. 8, a dummy active layout pattern 50d'' may be disposed in an island form. For example, the dummy active layout pattern 50d'' may be disposed as multiple island forms spaced apart from each other, e.g., along X and Y directions.

Figure 9:
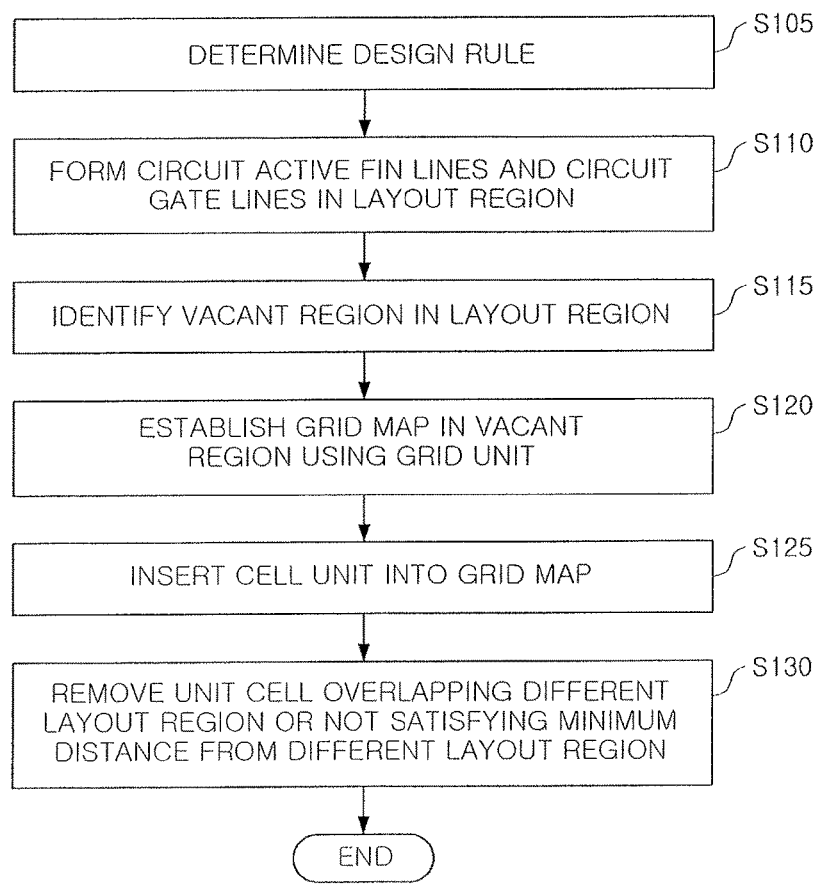
FIG. 9 illustrates a flowchart of an example of a semiconductor device layout method according to an example embodiment.

Next, another example of the semiconductor device layout will be described with reference to FIGS. 9 to 11D. First, another example of a layout method will be described with reference to FIGS. 9 to 10C. FIG. 9 is a flowchart illustrating an example of a semiconductor device layout method according to an example embodiment, and FIGS. 10A to 10C are plan views illustrating an example of a semiconductor device layout method according to an example embodiment.

With reference to FIGS. 9 and 10A, a design rule may be determined in operation S105. Determining the design rule may be identical to determining the design rule described above with reference to FIGS. 1 to 2D. Thus, as described above with reference to FIGS. 1 to 2D, the active fin units 3 (FIG. 2A) with the first pitch Pa, the gate units 6 (FIG. 2B) with the second pitch Pg, the grid unit 9 (FIG. 2C), and the cell unit 12 (FIG. 2D) may be determined.

Circuit active fin lines 3c and circuit gate lines 6c may be formed in a layout region 20' using the same method as that described above with reference to FIGS. 1 and 3A, in operation S110. In an example, the layout region 20' may be a region of layout of patterns which are formed using the active fin units 3 with the first pitch Pa and the gate units 6 with the second pitch Pg. In an example, the layout region 20' may be adjacent to another layout region 22, in which patterns having pitches different from the first and second pitches Pa and Pg are formed.

A vacant region 24' in the layout region 20' may be identified in operation S115. The vacant region 24' may be a region of the layout region 20' in which the circuit active fin lines 3c and the circuit gate lines 6c are not formed. A grid map 27' may be established in the vacant space 24' using the grid units 9 (see FIG. 2C) as described above with reference to FIG. 2C, in operation S120. The establishment of the grid map 27' may be performed using the substantially same method as the method of establishing the grid map 27 with reference to FIG. 3B. For example, the establishment of the grid map 27' may include arranging the grid units 9 from end portions of the circuit active fin lines 3c and the circuit gate lines 6c.

In an example, in the grid units 9 of the grid map 27', overlapping grid units 30 overlapping a boundary portion BR of the different layout region 22 may occur. The different layout region 22 may be a layout region in which active patterns formed to have a pitch different from that of the circuit active fin lines 3c while being formed together with the circuit active fin lines 3c on the same plane, and gate patterns formed to have a pitch different from that of the circuit gate lines 6c while being formed together with the circuit gate lines 6c on the same plane, may be formed. Referring to FIGS. 9 and 10B, the cell unit 12 (FIG. 2D) as described above with reference to FIG. 2D may be inserted into the grid map 27'. Thus, the active fin lines 4 and the gate lines 7, as described above with reference to FIG. 3C, may be formed.

In an example, in the grid units 9 of the grid map 27', the cell unit 12 (FIG. 2D) may be interposed between the overlapping grid units 30 overlapping the boundary portion BR of the different layout region 22. Thus, end portions of the active fin lines 4 and the gate lines 7 may overlap the different layout region 22.

With reference to FIGS. 9 and 10C, a unit cell, overlapping the different layout region 22 or not satisfying a minimum distance thereof from the different layout region 22 may be removed, in operation S130. For example, unit cells in the overlapping grid units 30 overlapping the boundary portion BR of the different layout region 22 may be removed. Thus, end portions of the active fin lines 4 and the gate lines 7 may not overlap the different layout region 22.

Subsequently, another example of a layout method will be described with reference to FIG. 9, and FIGS. 11A to 11D. FIGS. 11A to 11D are plan views illustrating an example of a semiconductor device layout method according to an example embodiment.

With reference to FIGS. 9 and 11A, a design rule may be determined in operation S105. The determination of the design rule may be identical to determining the design rule described above with reference to FIGS. 1 to 2D.

Circuit active fin lines 3c and circuit gate lines 6c may be formed in the layout region 20 using the same method as described above with reference to FIGS. 1 and 3A, in operation S110. Subsequently, an auxiliary gate layout 15 may be formed in the layout region 20. The auxiliary gate layout 15 may have a linear form extended in the second direction Y, and may have a width W in the first direction X that is greater than that of a single gate line 6c. The auxiliary gate layout 15 may not overlap the circuit gate lines 6c and the circuit active fin lines 3c. The auxiliary gate layout 15 may be disposed to be adjacent to end portions of the circuit active fin lines 3c while being parallel to the circuit gate lines 6c. As illustrated in FIGS. 1 and 3A, the vacant region 24 in the layout region 20 may be identified in operation S15. A region in which the auxiliary gate layout 15 is located in the layout region 20 may be recognized as the vacant region 24, e.g., the auxiliary gate layout 15 may be a portion of the vacant region 24. For example, when identifying the vacant region 24, the auxiliary gate layout 15 may be regarded as not being present.

With reference to FIGS. 9 and 11B, a grid map 27 may be established in the vacant region 24 using the grid unit 9 in the same manner as the description of FIGS. 1 and 3B, in operation S120. In the stage in which the vacant region 24 is identified, as the auxiliary gate layout 15 is regarded in such a manner that there is no auxiliary gate layout, the grid map 27 may include grid units overlapping the auxiliary gate layout 15, e.g., the grid map 27 may be marked in the vacant region 24 regardless of the auxiliary gate layout 15 to provide a uniform grid that overlaps the auxiliary gate layout 15 and contacts the circuit gate lines 6c and the circuit active fin lines 3c.

With reference to FIGS. 9 and 11C, the cell unit 12 (see FIG. 2D) may be interposed between the grid units 9 of the grid map 27 in the same manner as the description of FIGS. 1 and 3C, in operation S125. Thus, the active fin lines 4 including the circuit active fin lines 3c and the dummy active fin lines 3d, as described above with reference to FIG. 3C, and the gate lines 7 including the circuit gate lines 6c and the dummy gate lines 6d may formed. The active fin lines 4 and the gate lines 7 as described above may include portions overlapping the auxiliary gate layout 15.

With reference to FIGS. 9 and 11D, a unit cell, overlapping a different layout region or not satisfying a minimum distance thereof from the different layout region may be removed, in operation S130.

The auxiliary gate layout 15 may be set as a layout region different from the layout region 20. Subsequently, unit cells in a grid unit 33, overlapping the auxiliary gate layout 15 and not satisfying a minimum distance thereof from the auxiliary gate layout 15, may be removed therefrom. Thus, the unit cells in contact with the auxiliary gate layout 15 may be all removed. Thus, the active fin lines 4 and the gate lines 7 may be formed to prevent a portion thereof overlapping the auxiliary gate layout 15 from occurring. Thus, active fin lines 4' and gate lines 7' spaced apart from the auxiliary gate layout 19 may be formed.

According to example embodiments, layout methods for the formation of active fin patterns and gate lines, and layouts formed by the layout methods may be provided. According to example embodiments, layout methods, in which a margin of a semiconductor process performed to form patterns in a circuit region and patterns in a dummy region may be improved, and layouts formed using the layout methods may be provided. According to example embodiments, layout methods, in which patterns formed in a dummy region may be formed more densely, and layouts formed using the layout methods may be provided. According to example embodiments, layout methods, in which patterns formed in a dummy region are disposed at a required density, or a distance between patterns formed in a dummy region and patterns formed in a circuit region may be appropriate therefor, and layouts formed using the layout methods may be provided.

Layouts according to example embodiments may improve a process margin of a semiconductor process in which constituent elements, for example, active regions, active fin patterns, and gate lines, configuring a semiconductor device are formed. For example, in forming constituent elements of a semiconductor device according to an example embodiment, since a process margin may be improved in a photolithography process, an etching process, a planarizing process, e.g., a CMP, and the like, process defects may be reduced and productivity may be improved.

Hereinafter, a semiconductor device formed using layout methods according to example embodiments and layouts formed using the layout methods will be described.

Figure 13:
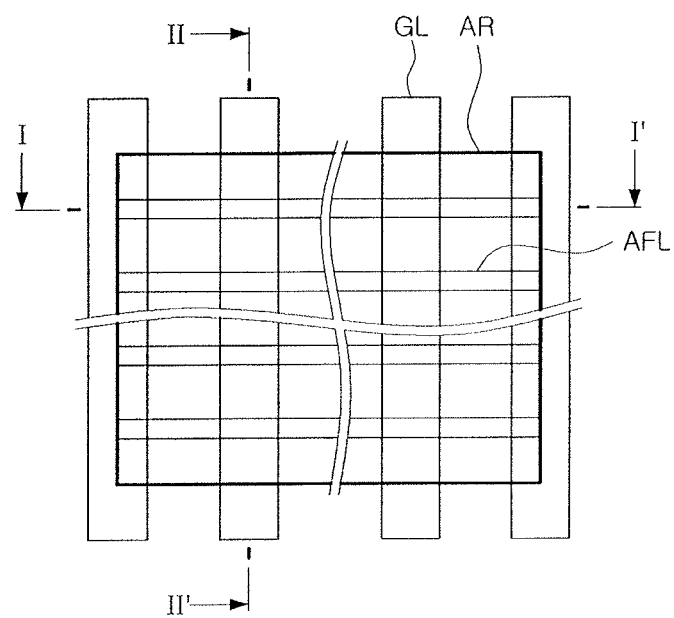
FIG. 13 illustrates a plan view of a semiconductor device according to example embodiments.

A semiconductor device according to example embodiments will be described with reference to FIGS. 12 and 13. FIG. 12 is a conceptual view of a semiconductor device according to example embodiments, and FIG. 13 is a plan view illustrating an example of a semiconductor device according to an example embodiment.

First, referring to FIG. 12, a semiconductor device 1 according to example embodiments may include a first region A1, a second region A2, and a third region A3.

In an example, the first region A1 may be a region including patterns formed at a same pitch on a single plane. In an example, the first region A1 may be a region in which layouts formed using the layout formation method described above with reference to FIGS. 1 to 11D may be disposed. For example, the first region A1 may include a region corresponding to the layout region 20 described with reference to FIG. 3A.

In an example, the first region A1 may include patterns formed at a pitch different from a pitch of the second region A2 and the third region A3, on a single plane. In an example, the first region A1 may be an element region having a largest area within the semiconductor device, e.g., a semiconductor chip, the second region A2 may be a memory device region, e.g., static random access memory (SRAM) or the like, and the third region A3 may be an element region including an I/O device region.

The semiconductor device 1 according to example embodiments may include row patterns arranged on first virtual linear lines CL extended in the first direction X, and column patterns arranged on second virtual linear lines RL extended in the second direction Y, perpendicular to the first direction X. The first linear lines CL may refer to row lines, and the second linear lines RL may refer to column lines. The virtual row lines CL may be virtual lines illustrating that the row patterns may be arranged on a straight, direct line, and the virtual column lines RL may be virtual lines illustrating that the column patterns may be arranged on a straight, direct line.

In an example, the row patterns may include active fin patterns, and the column patterns may include gate patterns. In an example, the row patterns may be final active fin patterns in a semiconductor device provided by forming active fin lines using a layout configured of the active fin lines 4, as illustrated in FIG. 4A, and then, patterning the active fin lines 4 using a layout configured of the active layout pattern 50, as illustrated in FIG. 6A. In an example, the column patterns may be final gate lines provided by forming gate lines using a layout configured of the gate lines 7, as illustrated in FIG. 4B, and then, patterning the gate lines, using a layout configured of the gate layout pattern 60 as illustrated in FIG. 6B. Examples of the finally obtained active fin patterns and the finally obtained gate lines will be described with reference to FIGS. 12 and 13.

Referring to FIGS. 12 and 13, the semiconductor device 1 according to an example embodiment may include an active region AR, active fin patterns AFL formed on the active region AR and extended in the first direction X, and gate lines GL extended in the second direction Y perpendicular to the first direction X. The active fin patterns AFL may be arranged on the first virtual linear lines CL extended in the first direction X. The gate lines GL may be arranged on the second virtual linear lines RL extended in the second direction Y.

Figure 14:
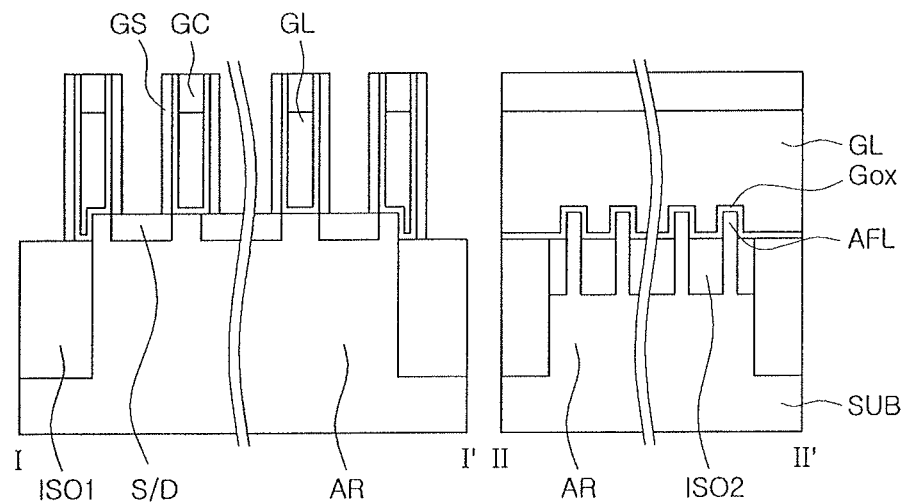
FIG. 14 illustrates a cross-sectional view of a semiconductor device according to example embodiments.

FIG. 14 is a cross-sectional view illustrating an example of patterns of the semiconductor device 1 according to an example embodiment. FIG. 14 is a cross-sectional view of regions taken along line I-I' and line II-II' of FIG. 13.

With reference to FIGS. 12 to 14, the active region AR may be disposed on a substrate SUB. The substrate SUB may be a semiconductor substrate formed of a semiconductor material, e.g., silicon or the like. The active fin patterns AFL may have a linear shape protruding from the active region AR and extended in the first direction X. The gate lines GL may be extended in a second direction Y perpendicular to the first direction X, and may overlap an upper surface and upper side surfaces of the active fin patterns AFL. The gate lines GL may be formed of a metal nitride and/or a conductive material, e.g., a metal or the like.

A first isolation region ISO1 defining the active region AR may be disposed on the substrate SUB. Second isolation regions ISO2 may be disposed on the active region AR. The second isolation regions ISO2 may be disposed on side surfaces of the active fin patterns AFL. Source/drain regions S/D may be disposed on the active fin patterns AFL adjacent to the gate lines GL. Gate dielectric portions Gox may be disposed on a bottom surface and a side surface of the gate lines GL. Gate capping patterns GC may be disposed on the gate lines GL. Gate spacers GS may be disposed on side surfaces of the gate lines GL. A transistor having a FinFET structure including the active fin patterns AFL, the gate dielectric portions Gox, the gate lines GL intersecting the active fin patterns AFL, and the source/drain regions S/D may be provided.

Figure 15:
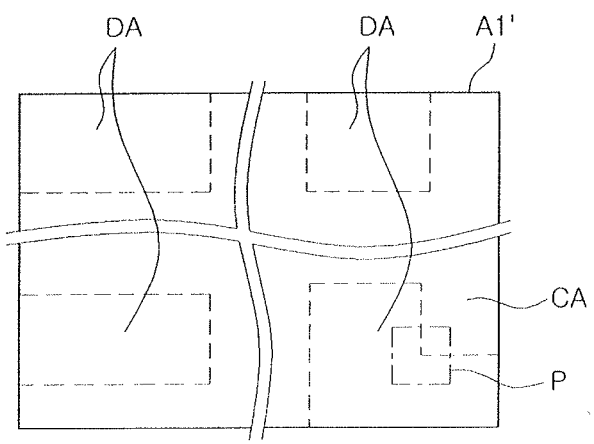
FIGS. 15, 16, 17A and 17B illustrate plan views of a semiconductor device according to an example embodiment.

A semiconductor device according to an example embodiment will be described with reference to FIGS. 15 to 17B. In FIGS. 15 to 17B, FIG. 15 is a plan view illustrating a portion of the first region A1 described above with reference to FIG. 12, FIG. 16 is an enlarged plan view of a portion represented by "P" of FIG. 15, FIG. 17A is a plan view illustrating active fin patterns of FIG. 16, and FIG. 17B is a plan view illustrating gate lines of FIG. 16.

Figure 16:
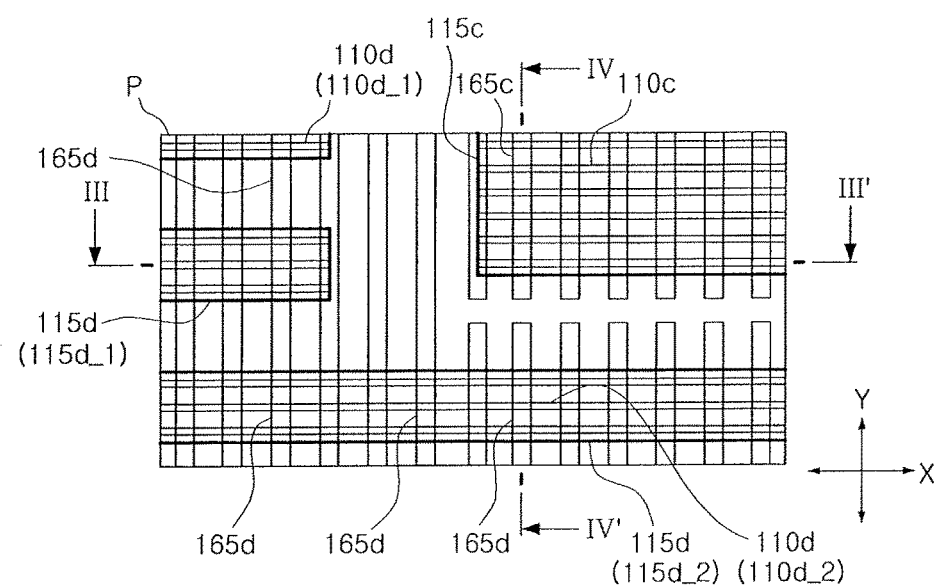
Figure 17A:
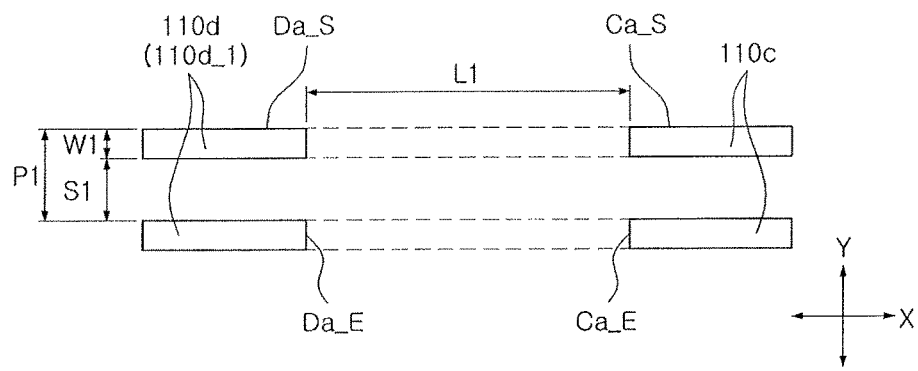
Figure 17B:
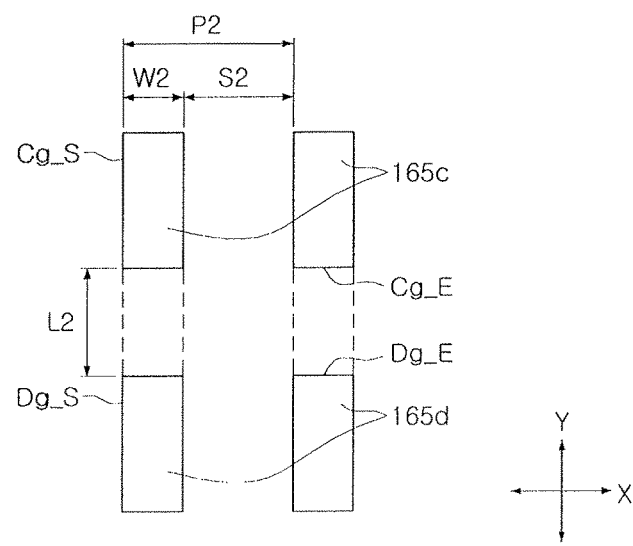

With reference to FIGS. 15 and 16, a first region A1' of a semiconductor device may include a circuit region CA and a dummy region DA. In an example, the first region A1' illustrated in FIG. 15 may be a portion of the first region A1 of the semiconductor device illustrated with reference to FIG. 12.

As illustrated in FIG. 16, a circuit active region 115c may be disposed on the circuit region CA, and a plurality of dummy active regions 115d may be disposed on the dummy region DA. In an example, in the case of the circuit active region 115c, a plurality of circuit active regions may be disposed according to a circuit configuration.

The circuit active fin patterns 110c may be disposed on the circuit active region 115c. Dummy active fin patterns 110d may be disposed on the plurality of dummy active regions 115d. The circuit and dummy active fin patterns 110c and 110d may have a linear shape extended in the first direction X. Two end portions of the circuit active fin patterns 110c may be aligned with side surfaces of the circuit active region 115c, and two end portions of the dummy active fin patterns 110d may be aligned with side surfaces of the plurality of dummy active regions 115d.

Circuit gate lines 165c may be disposed on the circuit region CA, and dummy gate lines 165d may be disposed on the dummy region DA. The circuit and dummy gate lines 165c and 165d may have a linear shape extended in the second direction Y. A density at which the dummy gate lines 165d are disposed may be higher than a layout density of the dummy active fin patterns 115d. The circuit active fin patterns 110c and the dummy active fin patterns 110d may be arranged on the first virtual linear lines extended in the first direction X. For example, the circuit active fin patterns 110c and the dummy active fin patterns 110d may be disposed on the first region A1 (FIG. 12) described above with reference to FIG. 12, and may be arranged on the first virtual linear lines extended in the first direction X.

The circuit gate lines 165c and the dummy gate lines 165d may be arranged on the second virtual linear lines RL (FIG. 12) extended in the second direction Y. For example, the circuit gate lines 165c and the dummy gate lines 165d may be disposed on the first region A1 (FIG. 12) described above with reference to FIG. 12, and may be arranged on the second virtual linear lines RL (see FIG. 12) extended in the second direction Y.

Among the plurality of dummy active regions 115d, a dummy active region disposed in the first direction X of the circuit active region 115c and nearest the circuit active region 115c may be referred to as a first-side dummy active region 115d_1, and a dummy active region disposed in the second direction Y of the circuit active region 115c and nearest the circuit active region 115c may be referred to as a second-side dummy active region 115d_2.

Dummy active fin patterns disposed on the first-side dummy active region 115d_1 may be referred to as first-side dummy fin patterns 110d_1, and dummy active fin patterns disposed on the second-side dummy active region 115d_2 may be referred to as second-side dummy fin patterns 110d_2. The circuit active fin patterns 110c and the first-side dummy fin patterns 110d_1 will be described below with reference to FIG. 17A.

As illustrated in FIG. 17A, the circuit active fin patterns 110c and the first-side dummy fin patterns 110d_1 may be formed at the same pitch. The pitch may indicate a distance between an edge of one pattern and an edge of another pattern corresponding thereto and adjacent thereto. For example, the circuit active fin patterns 110c and the first-side dummy fin patterns 110d_1 may have the same first width W1 and may be spaced apart from each other at a first distance S1, and a sum of the first width W1 and the first distance S1 may be a first pitch P1.

End portions Ca_E of the circuit active fin patterns 110c may oppose end portions Da_E of the first-side dummy fin patterns 110d_1. The circuit active fin patterns 110c and the first-side dummy fin patterns 110d_1 may be aligned with each other. The first-side dummy fin patterns 110d 1 may be disposed on virtual linear lines extended from the circuit active fin patterns 110c. Sides Ca_S of the circuit active fin patterns 110c may be aligned with sides Da_S of the first-side dummy active fin patterns 110d_1. A distance L1 between the circuit activity pin patterns 110c and the first-side dummy active patterns 110d_1 may be substantially identical to a distance between the circuit active region 115c and the first-side dummy active region 115d_1.

The circuit gate lines 165c and the dummy gate lines 165d, of which end portions oppose each other, will be described below with reference to FIG. 17B.

Referring to FIG. 17B, the gate circuit lines 165c and the dummy gate lines 165d may be formed at the same pitch. For example, the circuit gate lines 165c and the dummy gate lines 165d may have the same second width W2 and may be spaced apart from each other at a second distance S2, and a sum of the second width W2 and the second distance S2 may be a second pitch P2. End portions Cg_E of the circuit gate lines 165c may oppose end portions Dg_E of the dummy gate lines 165d.

The circuit gate lines 165c and the dummy gate lines 165d may be aligned with each other. The dummy gate lines 165d may be disposed on virtual linear lines extended from the gate lines 165c. Sides Cg_S of the circuit gate lines 165c may be aligned with sides Dg_S of the dummy gate lines 165d. A distance L2 between the circuit gate lines 165c and the dummy gate lines 165d may be less than the distance L1 (see FIG. 17A) between the circuit active fin patterns 110c and the first-side dummy fin patterns 110d_1.

An example of a semiconductor device, including the plurality of dummy active regions 115d, the dummy active fin patterns 110d, the circuit active region 115c, the circuit active fin patterns 110c, the dummy gate lines 165d, and the circuit gate lines 165c described above with reference to FIGS. 16 to 17B, will be described below with reference to FIGS. 18A and 18B.

Figure 18A:
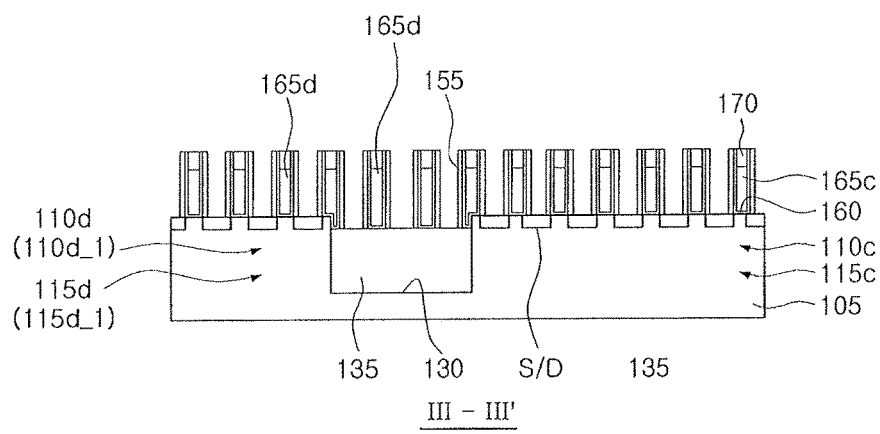
FIGS. 18A and 18B illustrate cross-sectional views of a semiconductor device according to an example embodiment.
Figure 18B:
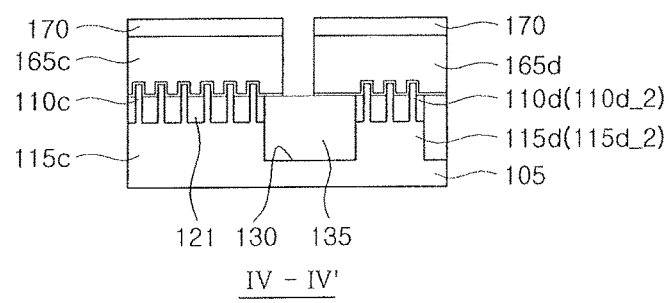

FIG. 18A is a cross-sectional view illustrating a region taken along line of FIG. 16, and FIG. 18B is a cross-sectional view illustrating a region taken along line IV-IV' of FIG. 16.

With reference to FIGS. 15 to 18B, the plurality of dummy active regions 115d and the circuit active region 115c may be disposed on a substrate 105. The substrate 105 may be a semiconductor substrate.

The plurality of dummy active regions 115d and the circuit active region 115c may be defined by a first isolation region 135 disposed on the substrate 105. The first isolation region 135 may be formed of an insulating material such as silicon oxide or the like.

The plurality of dummy active fin patterns 110*d* may protrude from the plurality of dummy active regions 115*d*, and the plurality of circuit active fin patterns 110*c* may protrude from the circuit active region 115*c*.

A second isolation region 121 may be disposed on sides of the dummy active fin patterns 110*d* and the circuit active fin patterns 110*c*. The second isolation region 121 may be formed of an insulating material such as silicon oxide or the like. The second isolation region 121 may have an upper surface lower than upper surfaces of the dummy active fin patterns 110*d* and the circuit active fin patterns 110*c*.

Figure 19:
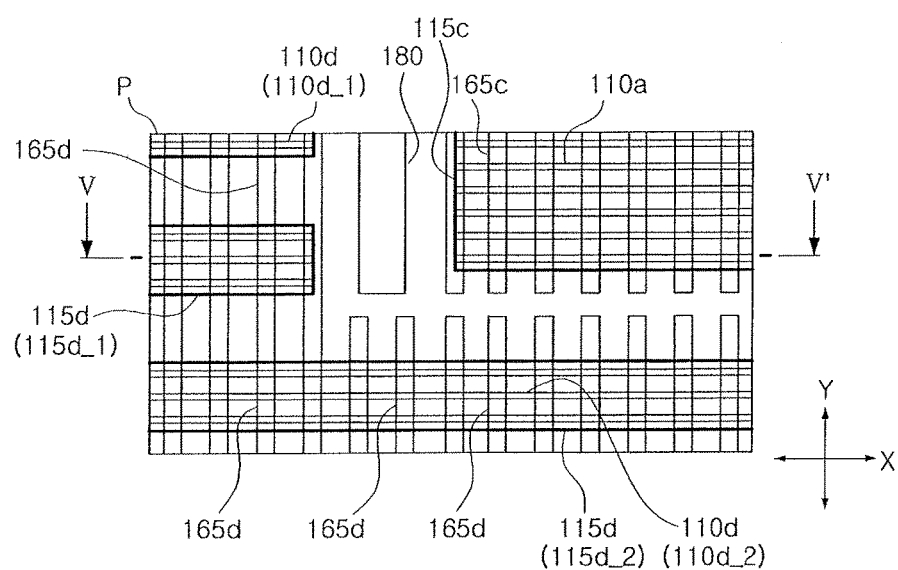
FIG. 19 illustrates a plan view of another example of a semiconductor device according to an example embodiment.

The dummy gate lines 165*d* may intersect the dummy active fin patterns 110*d* on the dummy active regions 115*d*, and the circuit gate lines 165*c* may intersect the circuit active fin patterns 110*d* on the circuit active region 115*c*. The gate circuit lines 165*c* and the dummy gate lines 165*d* may be continuously arranged while having the same width, in the first direction X, but are not limited thereto. For example, in the circuit gate lines 165*c* and the dummy gate lines 165*d*, an auxiliary gate pattern may be disposed between circuit gate lines and dummy gate lines adjacent to each other. The auxiliary gate pattern will be described below with reference to FIGS. 19 and 20. FIG. 19 is a plan view of a semiconductor device according to an example embodiment, and FIG. 20 is a cross-sectional view of a region taken along line V-V' of FIG. 19.

Figure 20:
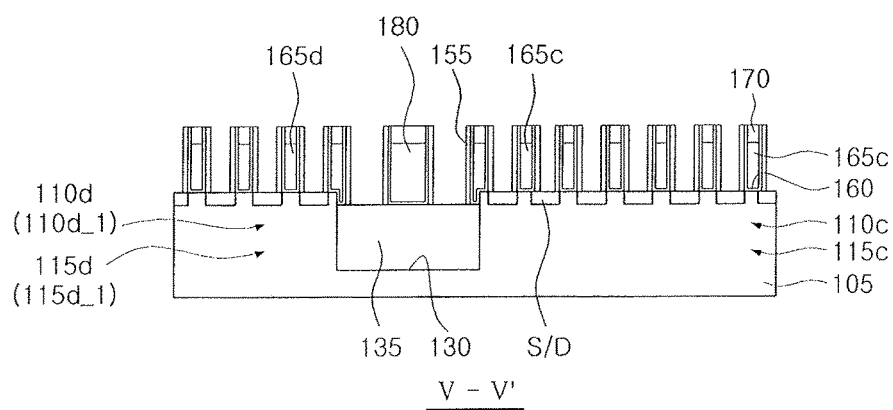
FIG. 20 illustrates a cross-sectional view of a semiconductor device according to an example embodiment.

With reference to FIGS. 19 and 20, in the circuit gate lines 165*c* and the dummy gate lines 165*d*, an auxiliary gate pattern 180 may be disposed between a circuit gate line 165*c* and a dummy gate line 165*d* adjacent to each other. The auxiliary gate pattern 180 may be parallel to the circuit and dummy gate lines 165*c* and 165*d*.

The auxiliary gate pattern 180 may have a width greater than that of the circuit and dummy gate lines 165*c* and 165*d* which may be formed to have the same width. The auxiliary gate pattern 180 is formed to have a width greater than other patterns adjacent thereto, for example, the circuit gate lines 165*c*, and may thus serve as a structure preventing the circuit gate lines 165*c* from collapsing or being transformed.

Figure 21:
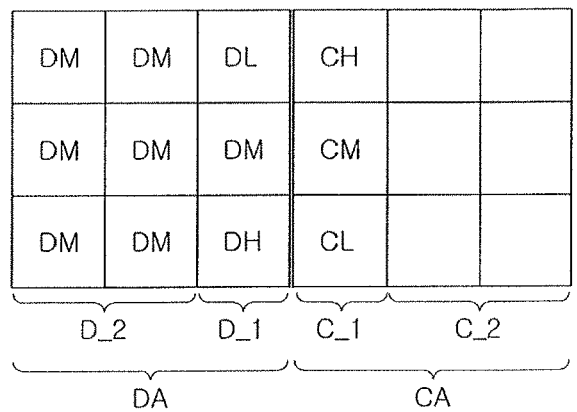
FIG. 21 illustrates a conceptual diagram of a semiconductor device according to example embodiments.

An example of disposition of constituent elements configuring a semiconductor device according to an example embodiment will be described below with reference to FIG. 21. FIG. 21 is a conceptual diagram illustrating a layout density of a semiconductor device according to example embodiments.

Referring to FIG. 21, the circuit region CA may include a first circuit region C_1 and a second circuit region C_2, and the dummy region DA may include a first dummy region D_1 and a second dummy region D_2. The first circuit region C_1 and the first dummy region D_1 are adjacent to each other or may face each other, and the second circuit region C_2 may be spaced apart from the first dummy region D_1. The first circuit region C_1 and the first dummy region D_1 may be referred to as an adjacent circuit region and an adjacent dummy region, respectively.

In an example, the first circuit region, for example, an adjacent circuit region C_1, may be disposed between the second circuit region C_2 and the first dummy region, for example, an adjacent dummy region D_1. The adjacent dummy region D_1 may be disposed between the adjacent circuit region C_1 and the second dummy region D_2.

Circuit patterns may be disposed in the circuit region CA, and dummy patterns may be disposed in the dummy region DA. The dummy patterns of the dummy region DA may be disposed in consideration of a layout density of the circuit patterns of the circuit region CA disposed on a single plane or a single layer. For example, the dummy active regions 115*d* (see FIG. 16) of the dummy region DA may be disposed in consideration of a layout density of the circuit active region 115C (see FIG. 16) of the circuit region CA disposed on a single plane. The dummy active fin patterns 110*d* (see FIG. 16) of the dummy region DA may be disposed in consideration of a layout density of the circuit active fin patterns 110C (see FIG. 16) of the circuit region CA disposed on a single plane. The dummy gate lines 165*d* (see FIG. 16) of the dummy region DA may be disposed in consideration of a layout density of the circuit gate lines 165C (see FIG. 16) of the circuit region CA disposed on a single plane.

In an example, the layout density may be understood as a density with respect to a flat area.

In an example, the adjacent circuit region C_1 of the circuit region CA may be divided into two or more regions in which circuit patterns may be disposed at different densities. For example, the adjacent circuit region C_1 may include a high-density circuit region CH in which circuit patterns may be disposed at a higher density than an average density of circuit patterns in the entirety of the circuit region CA, a low-density circuit region CL in which circuit patterns may be disposed at a lower density than an average density of circuit patterns in the entirety of the circuit region CA, and a medium-density circuit region CM in which circuit patterns may be disposed at an average density corresponding to an average density of circuit patterns of the circuit region CA. Thus, a layout density of circuit patterns of the high-density circuit region CH may be higher than a layout density of circuit patterns of the medium-density circuit region CM and the low-density circuit region CL, and a layout density of circuit patterns of the medium-density circuit region CM may be a density between the layout density of circuit patterns of the high-density circuit region CH and the layout density of circuit patterns of the low-density circuit region CL.

The adjacent dummy region D_1 of the dummy region DA may include a high density dummy region DH facing or adjacent to the low-density circuit region CL, a low-density dummy region DL facing or adjacent to the high-density circuit region CH, and a medium-density dummy region DM facing or adjacent to the medium-density circuit region CM. The high-density dummy region DH may be a region in which dummy patterns may be disposed at a higher density than an average density of circuit patterns of the circuit region CA, and the low-density dummy region DL may be a region in which dummy patterns may be disposed at a lower density than an average density of circuit patterns of the circuit region CA. The medium-density dummy region DM may be a region in which dummy patterns may be disposed at an average density corresponding to an average density of circuit patterns of the circuit region CA.

In the dummy region DA, the second dummy region D_2 spaced apart from the circuit region CA by the adjacent dummy region D_1 may include the medium-density dummy regions DM disposed therein.

The adjacent circuit region C_1 of the circuit region CA may be divided into two or more regions in which circuit patterns may be disposed at different densities. For example, as illustrated in FIG. 21, the adjacent circuit region C_1 may be divided into three regions CH, CL and CM in which circuit patterns may be disposed at different densities, but is not limited thereto. For example, the adjacent circuit region C_1 may be divided into two regions in which circuit patterns may be disposed at different densities, for example, the high-density circuit region CH and the low-density circuit region CL.

Figure 22:
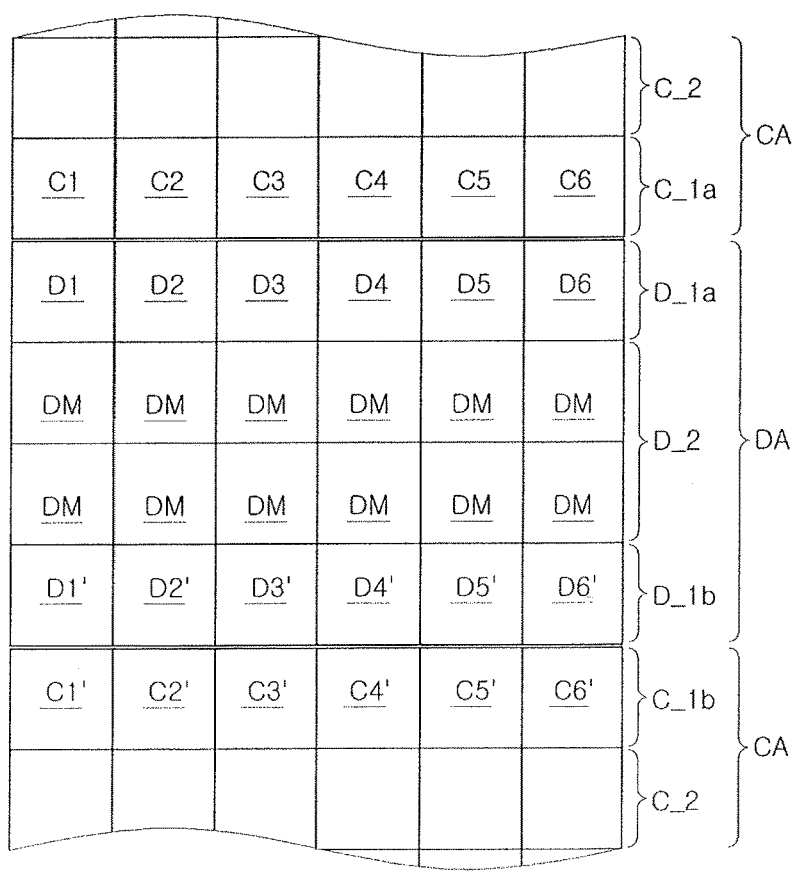
FIG. 22 illustrates a conceptual view of a semiconductor device according to an example embodiment.
Figure 23:
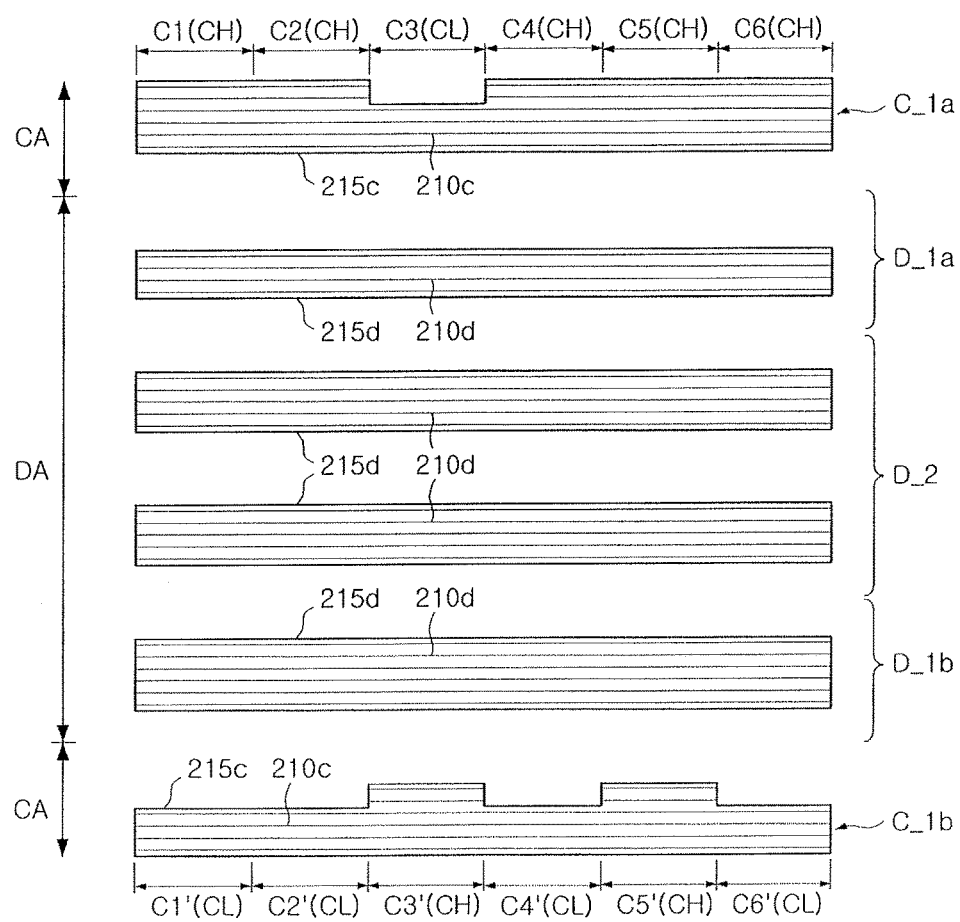
FIG. 23 illustrates a plan view of an example of a semiconductor device according to an example embodiment.
Figure 24:
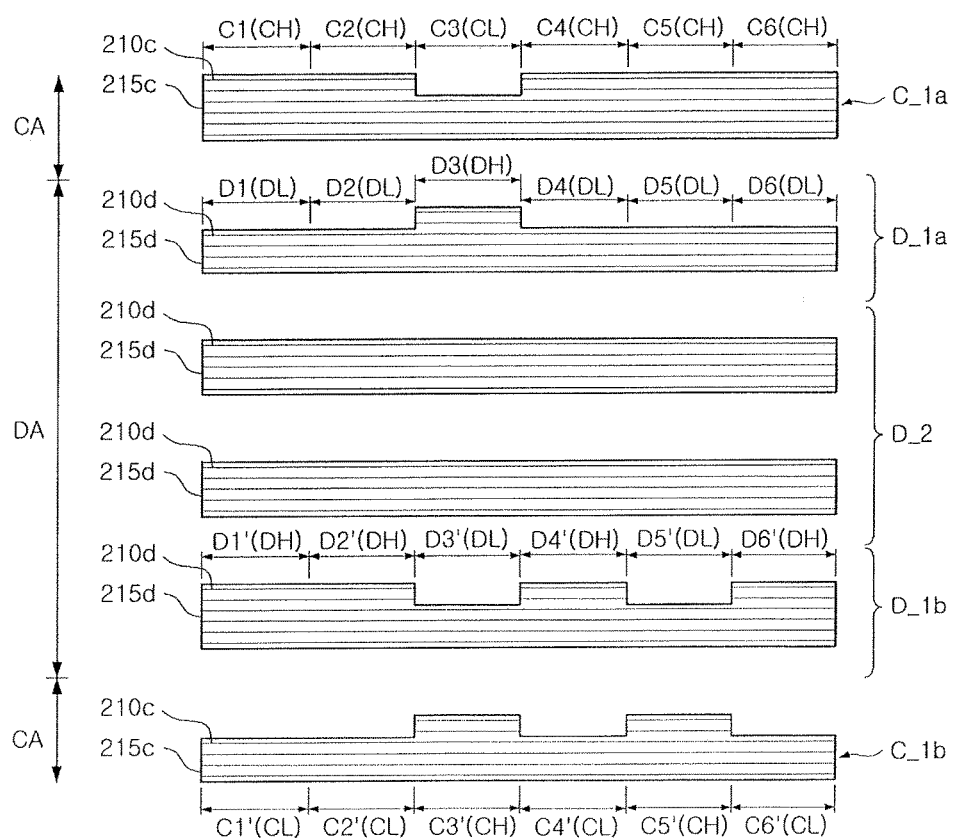
FIG. 24 illustrates a plan view of an example of a semiconductor device according to an example embodiment.
Figure 25:
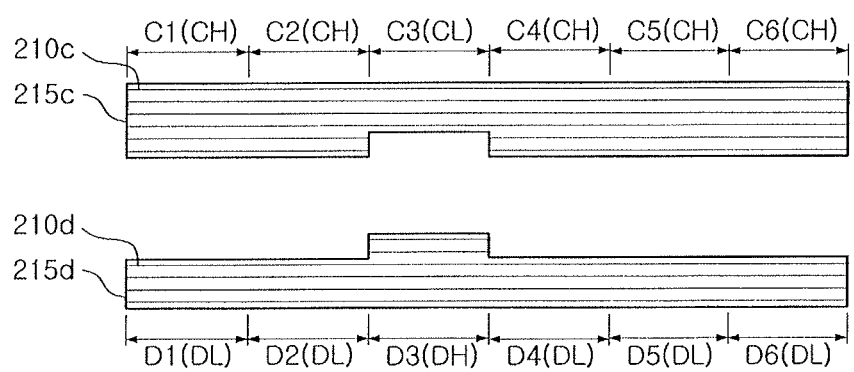
FIG. 25 illustrates a plan view of an example of a semiconductor device according to an example embodiment.
Figure 26:
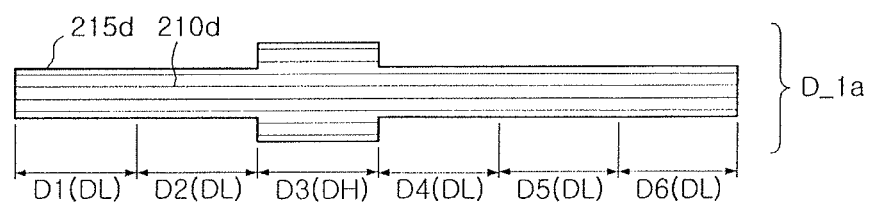
FIG. 26 illustrates a plan view of an example of a semiconductor device according to an example embodiment.

An example of layout of constituent elements configuring a semiconductor device according to an example embodiment will be described below with reference to FIGS. 22 to 26. FIG. 22 is a conceptual view illustrating a layout of constituent elements configuring a semiconductor device according to an example embodiment, FIG. 23 is a plan view illustrating an example of a layout of constituent elements configuring a semiconductor device according to an example embodiment, FIG. 24 is a plan view illustrating another example of a layout of constituent elements configuring a semiconductor device according to an example embodiment, FIG. 25 is a plan view illustrating another example of a layout of constituent elements configuring a semiconductor device according to an example embodiment, and FIG. 26 is a plan view illustrating another example of a layout of constituent elements configuring a semiconductor device according to an example embodiment.

First, with reference to FIG. 22, a semiconductor device according to an example embodiment will be described below.

Referring to FIG. 22, a semiconductor device according to an example embodiment may include a circuit region CA and a dummy region DA.

The circuit region CA may include a first circuit region and a second circuit region C_2. The first circuit region may be disposed between the dummy region D2 and the second circuit region C_2, and the second circuit region C_2 may be spaced apart from the dummy region DA.

In an example, the first circuit region of the circuit region CA may include a first adjacent circuit region C_1a facing or adjacent to one side of the dummy region DA and a second adjacent circuit region C-1b facing or adjacent to another side of the dummy region DA. The dummy region DA may be disposed between the first adjacent circuit region C_1a and the second adjacent circuit region C_1b. The dummy region DA may include a first dummy region and a second dummy region D_2. The first dummy region may be disposed between the second dummy region D_2 and the circuit region CA.

In an example, the first dummy region of the dummy region DA may include a first adjacent dummy region D_1a facing or adjacent to the first adjacent circuit region C_1a and a second adjacent dummy region D_1b facing or adjacent to the second adjacent circuit region C_1b. A layout density of dummy patterns of the second dummy region D_2 may be equal to or similar to an average layout density of circuit patterns of the circuit region CA.

In an example, an average layout density of the dummy patterns and the circuit patterns of the first adjacent dummy region D_1a and the first adjacent circuit region C_1a may be equal to or similar to an average density of circuit patterns of the circuit region CA. Thus, a layout density of dummy patterns of the first adjacent dummy region D_1a may be determined depending on a layout density of circuit patterns of the first adjacent circuit region C_1a, and a layout density of dummy patterns of the second adjacent dummy region D_1b may be determined depending on a layout density of circuit patterns of the second adjacent circuit region C_1b. For example, when an average layout density of the circuit patterns of the first adjacent circuit region C_1a is higher than an average density of circuit patterns of the circuit region CA, an average layout density of the first adjacent dummy region D_1a may be lower than an average density of circuit patterns of the circuit region CA. In a manner different therefrom, for example, when an average layout density of the circuit patterns of the first adjacent circuit region C_1a is lower than an average density of circuit patterns of the circuit region CA, an average layout density of the dummy patterns of the first adjacent dummy region D_1a may be higher than an average density of circuit patterns of the circuit region CA. In a manner different therefrom, for example, when an average layout density of the circuit patterns of the first adjacent circuit region C_1a is equal or similar to an average density of circuit patterns of the circuit region CA, an average layout density of the dummy patterns of the first adjacent dummy region D_1a may be equal or similar to an average density of circuit patterns of the circuit region CA. A relationship between an average layout density of circuit patterns of the first adjacent circuit region C_1a and a layout density of dummy patterns of the first adjacent dummy region D_1a may be identically applied to a relationship between a layout density of circuit patterns of the second adjacent circuit region C_1b and a layout density of dummy patterns of the second adjacent dummy region D_1b.

In an example, the first adjacent circuit region C_1a may include a plurality of portions, and the first adjacent dummy region D_1a may include a plurality of portions facing the plurality of portions of the first adjacent circuit region C_1a.

In an example, a layout density of dummy patterns of the plurality of portions of the first adjacent dummy region D_1a may be changed according to a layout density of circuit patterns of the plurality of portions of the first adjacent circuit region C_1a. For example, the first adjacent circuit region C_1a may include first to sixth circuit portions C1, C2, C3, C4, C5, and C6, the first adjacent dummy region D_1a may include first to sixth dummy portions D1, D2, D3, D4, D5, and D6 facing the first to sixth circuit portions C1, C2, C3, C4, C5, and C6. For example, when any one of the first to sixth circuit portions C1, C2, C3, C4, C5, and C6 of the first adjacent circuit region C_1a is a high-density adjacent circuit region, any one of first to sixth dummy portions D1, D2, D3, D4, D5, and D6 of the first adjacent dummy region D_1a, facing the high-density adjacent circuit region, may be a low-density adjacent dummy region. In a manner different therefrom, for example, when any one of the first to sixth circuit portions C1, C2, C3, C4, C5, and C6 of the first adjacent circuit region C_1a is a low-density adjacent circuit region, any one of the first to sixth dummy portions D1, D2, D3, D4, D5, and D6 of the first adjacent dummy region D_1a, facing the low-density adjacent circuit region, may be a high-density adjacent dummy region.

In the same manner as the first adjacent circuit region C_1a and the first adjacent dummy region D_1a, the second adjacent circuit region C_1b may include first to sixth circuit portions C1', C2', C3', C4', C5', and C6', and the second adjacent dummy region D_1b may include first to sixth dummy portions D1', D2', D3', D4', D5', and D6'. A relationship between the first to sixth circuit portions C1', C2', C3', C4', C5', and C6' of the second adjacent circuit region C_1b and the first to sixth dummy portions D1', D2', D3', D4', D5', and D6' of the second adjacent dummy region D_1b may be identical to a relationship between the first to sixth circuit portions C1, C2, C3, C4, C5, and C6 of the first adjacent circuit region C_1a and the first to sixth dummy portions D1, D2, D3, D4, D5', and D6 of the first adjacent dummy region D_1a.

Referring to FIGS. 22 and 23, an example of patterns of the circuit region CA and the dummy region DA will be described below.

Referring to FIGS. 22 and 23, circuit active regions 215c and circuit active fin patterns 210c may be disposed in the circuit region CA. Dummy active regions 215d and dummy active fin patterns 210d may be disposed in the dummy region DA. The circuit active fin patterns 210c may be disposed on the circuit active regions 215c, and the dummy active fin patterns 210d may be disposed on the dummy active regions 215d.

In an example, the circuit active regions 215c may correspond to the circuit active region 115c described above with reference to FIG. 16, the dummy active regions 215d may correspond to the second-side dummy active region 115d_2 described above with reference to FIG. 16, the circuit active fin patterns 210c may correspond to the circuit active fin patterns 110c described above with reference to FIG. 16, and the dummy active fin patterns 210d may correspond to the second-side dummy fin patterns 110d_2 described above with reference to FIG. 16. Thus, a description of the circuit active regions 215c, the dummy active regions 215d, the circuit active fin patterns 210c and the dummy active fin patterns 210c may be identically applied to the circuit active region 115c, the second-side dummy active region 115d_2, the circuit active fin patterns 110c and the second-side dummy fin patterns 110d_2. The first, second, fourth, fifth and sixth portions C1, C2, C4, C5, and C6 of the first adjacent circuit region C_1a may be a high density circuit region CH in which circuit patterns, for example, the circuit active regions 215c or the circuit active fin patterns 210c, have a relatively high density, and the third portion C3 of the first adjacent circuit region C_1a may be a low density circuit region CL in which circuit patterns, for example, the circuit active regions 215c or the circuit active fin patterns 210c, have a relatively low density. Thus, a layout density of the circuit active fin patterns 210c in the first to sixth portions C1 to C6 of the first adjacent circuit region C_1a may be higher than an average layout density of the circuit active fin patterns 210c in the circuit region CA. In the first adjacent circuit region C_1a, the first, second, fourth, fifth and sixth portions C1, C2, C4, C5, and C6 may be portions in which the layout number of the circuit active fin patterns 210c is increased, and the third portion C3 may be a portion in which the layout number of the circuit active fin patterns 210c is relatively reduced.

An area density of the circuit active region 215c in the first to sixth portions C1 to C6 of the first adjacent circuit region C_1a may be higher than an average area density of the circuit active region 215c in the circuit region CA.

Among dummy active fin patterns 210d disposed in the dummy region DA, a density of the dummy active fin patterns 210d or the dummy active region 215d disposed in the first to sixth dummy portions D1, D2, D3, D4, D5, and D6 of the first adjacent dummy region D_1a may be lower than an average density of the circuit active fin patterns 210c in the circuit region CA. For example, the dummy active region 215d disposed in the first to sixth dummy portions D1, D2, D3, D4, D5, and D6 of the first adjacent dummy region D_1a may be disposed in a linear shape having a predetermined width, and the dummy active fin patterns 210d disposed on the dummy active region 215d may be disposed in a predetermined number. By reducing a width of the dummy active region 215d to decrease a flat area of the dummy active area 215d, a density of the dummy active region 215d in the first adjacent dummy region D_1a may be reduced, and a density of the dummy active fin patterns 210d disposed on the dummy active region 215d of which the density has been reduced as described above may also be reduced.

The third and fifth portions C3 and C5 of the second adjacent circuit region C_1b may be a high density circuit region CH in which a density of the circuit active regions 215c or the circuit active fin patterns 210c is relatively high, and the first, second, fourth and sixth portions C1, C2, C4 and C6 of the second adjacent circuit region C_1b may be a low density circuit region CL in which a density of the circuit active regions 215c or the circuit active fin patterns 210c is relatively low. Thus, a layout density of the circuit active fin patterns 210c in the first to sixth portions C1', C2', C3', C4', C5', and C6' of the second adjacent circuit region C_1b may be lower than an average layout density of the circuit active fin patterns 210c in the circuit region CA. An area density of the circuit active region 215c in the first to sixth portions C1' to C6' of the second adjacent circuit region C_2a may be lower than an average area density of the circuit active region 215c in the circuit region CA.

A density of the dummy active fin patterns 210d or the dummy active region 215d disposed in the first to sixth dummy portions D1', D2', D3', D4', D5', and D6' of the second adjacent dummy region D_1b may be higher than an average density of the circuit active fin patterns 210c of the circuit region CA. For example, the dummy active region 215d disposed in the first to sixth dummy portions D1' to D6' of the second adjacent dummy region D_1b may be disposed in a linear shape having a predetermined width, and the dummy active fin patterns 210d disposed on the dummy active region 215d may be disposed in a predetermined number. By increasing a width of the dummy active region 215d to increase a flat area of the dummy active area 215d, a density of the dummy active region 215d in the second adjacent dummy region D_1b may be increased, and a density of the dummy active fin patterns 210d disposed on the dummy active region 215d of which the density has been increased as described above may also be increased.

Dummy patterns disposed in the second dummy region D_2, for example, a density of the dummy active region 215d or the dummy active fin patterns 210d may be equal or similar to an average density of circuit patterns of the circuit region CA, for example, an average density of the circuit active fin patterns 210c or the circuit active region 215c.

Dummy patterns disposed in the second dummy region D_2, for example, a density of the dummy active region 215d or the dummy active fin patterns 210d may be lower than a density of dummy patterns in the first adjacent dummy region D_1a, for example, the dummy active region 215d or the dummy active fin patterns 210d, and may be higher than a density of dummy patterns in the second adjacent dummy region D_1b, for example, a density of the dummy active region 215d or the dummy active fin patterns 215d.

Next, referring to FIGS. 22 and 24, an example of patterns of the circuit region CA and the dummy region DA will be described below.

With reference to FIGS. 22 and 24, the circuit active regions 215c and the circuit active fin patterns 210c may be disposed in the circuit region CA in a manner similar to that of the illustration of FIG. 23. The dummy active regions 215d and the dummy active fin patterns 210d may be disposed in the dummy region DA.

The circuit region CA may include the first adjacent circuit region C_1a and the second adjacent circuit region C_1b, identical to the description with reference to FIG. 23.

The first, second, fourth, fifth and sixth portions C1, C2, C4, C5, and C6 of the first adjacent circuit region C_1a may be a high density circuit region CH in which circuit patterns, for example, the circuit active regions 215c or the circuit active fin patterns 210c, have a relatively high density, and the first, second, fourth, fifth and sixth portions D1, D2, D4, D5, and D6 of the first adjacent dummy region D_1a facing the first, second, fourth, fifth and sixth portions C1, C2, C4, C5, and C6 of the first adjacent circuit region C_1a may be a low density circuit dummy region DL in which dummy patterns, for example, the dummy active regions 215d or the dummy active fin patterns 210c, have a relatively low density.

The third portion C3 of the first adjacent circuit region C_1a may be a low density circuit region CL in which circuit patterns, for example, the circuit active regions 215c or the circuit active fin patterns 210c, have a relatively low density, and the third portion D3 of the first adjacent dummy region D_1a facing the third portion C3 of the first adjacent circuit region C_1a may be a high density dummy region DH in which dummy patterns, for example, the dummy active regions 215d or the dummy active fin patterns 210d, have a relatively high density.

The third and fifth portions C3' and C5' of the second adjacent circuit region C_1b may be a high density circuit region CH in which the circuit active regions 215c or the circuit active fin patterns 210c have a relatively high density, and the third and fifth portions C3' and C5' of the second adjacent dummy region D_1b facing the third and fifth portions C3' and C5' of the second adjacent circuit region C_1b may be a low density dummy region DL in which dummy patterns, for example, the dummy active regions 215d or the dummy active fin patterns 210d, have a relatively low density.

In a manner similar to FIG. 23, dummy patterns disposed in the second dummy region D_2, for example, a density of the dummy active region 215d or the dummy active fin patterns 210d may be equal or similar to an average density of circuit patterns of the circuit region CA, for example, the circuit active region 215c or the circuit active fin patterns 210c.

In an example, the dummy active regions 215d in the first and second adjacent dummy regions D_1a and D_1b may have a relatively great width in the high density dummy region DH rather than in the low density dummy region DL.

In the dummy active regions 215d, a portion thereof having a relatively large width, for example, the number of the dummy active fin patterns 210d disposed in the high density dummy region DH may be higher than the number of portions thereof having a relatively small width, for example, the number of the dummy active fin patterns 210d disposed in the low density dummy region DL.

In an example, the dummy active regions 215d in the first and second adjacent dummy regions D_1a and D_1b may have a portion having an increased width while protruding in any single direction. As described above, the portion of the dummy active regions 215d having an increased width may become the high density dummy region DH.

In an example, the dummy active regions 215d in the first and second adjacent dummy regions D_1a and D_1b and the circuit active regions 215c in the first and second adjacent circuit regions C_1a and C_1b may protrude in a single direction to have an increased width, but are not limited thereto. For example, as illustrated in FIG. 25, the circuit active region 215c of the first adjacent circuit region C_1a and the dummy active region 215d of the first adjacent dummy region D_1a may have portions protruding in different directions. As illustrated in FIG. 25, the circuit active region 215c of the first adjacent circuit region C_1a may have a portion protruding toward the low density dummy region DL of the first adjacent dummy region D_1a, and the dummy active region 215d of the first adjacent dummy region D_1a may have a portion protruding toward the low density circuit region CL of the first adjacent circuit region C_1a.

In an example, the dummy active regions 215d in the first and second adjacent dummy regions D_1a and D_1b and the circuit active regions 215c in the first and second adjacent circuit regions C_1a and C_1b may protrude from any one side to have an increased width, but are not limited thereto. For example, as illustrated in FIG. 26, the dummy active region 215d of the first adjacent dummy region D_1a may protrude from two sides to have a portion in which a width thereof is increased.

Figure 27:
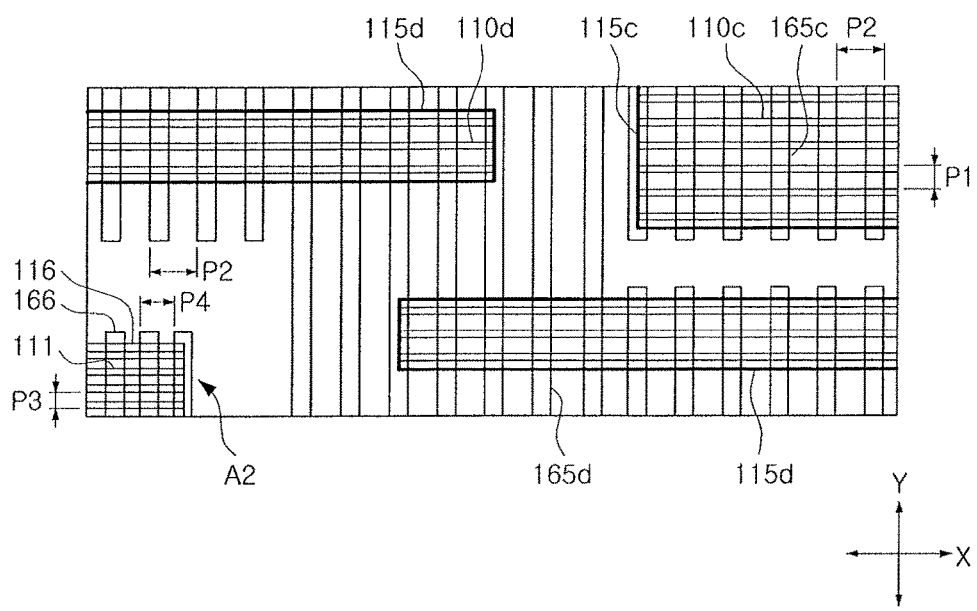
FIG. 27 illustrates a plan view of a semiconductor device according to an example embodiment.

FIG. 27 is a plan view of a semiconductor device according to an example embodiment. FIG. 27 is a plan view illustrating portions of the first region A1 and the second region A2 described above with respect to FIG. 12.

Referring to FIGS. 12 and 27, a semiconductor device may include the first region A1 and the second region A2 as illustrated in FIG. 12.

On a circuit region of the first region A1, a first circuit active region 115c, first circuit active fin patterns 110c disposed on the first circuit active region 115c and extended in a first direction X, and first circuit gate lines 165c intersecting the first circuit active fin patterns 110c, while being extended in a second direction Y perpendicular to the first direction X, may be disposed.

On a dummy region of the first region A1, dummy active regions 115d, dummy active fin patterns 110d disposed on the dummy active regions 115d, and dummy gate lines 165d spaced apart from the first circuit gate lines 165c, may be disposed.

On the second region A2, a second circuit active region 116, second circuit active fin patterns 111 disposed on the second circuit active region 116 and intersecting the second circuit active region 116, and second circuit gate lines 116 disposed on the second circuit active region 116 and intersecting the second circuit active fin patterns 116, may be disposed. The second circuit active fin patterns 111 may have a linear shape extended in the first direction X. The second circuit gate lines 166 may have a linear shape extended in the second direction Y.

In an example, the second circuit active fin patterns 111 may be disposed at a pitch different from pitches of the first circuit active fin patterns 110c and the dummy active fin patterns 110d. For example, the first circuit active fin patterns 110c and the dummy active fin patterns 110d may be disposed at a first pitch P1, and the second circuit active fin patterns 111 may be disposed at a third pitch P3, less than the first pitch P1.

In an example, the second circuit gate lines 166 may be disposed at a pitch different from a pitch of the first circuit gate lines 165c and the dummy gate lines 165d. For example, the first circuit gate lines 165c and the dummy gate lines 165d may be disposed at a second pitch P2, while the second circuit gate lines 166 may be disposed at a fourth pitch P4, less than the second pitch P2.

In an example, the second circuit active fin patterns 111 may not be aligned with the dummy active fin patterns 110d on a virtual straight line. As an example, the second circuit gate lines 166 may not be aligned with the dummy gate lines 165d on a virtual straight line.

Figure 28:
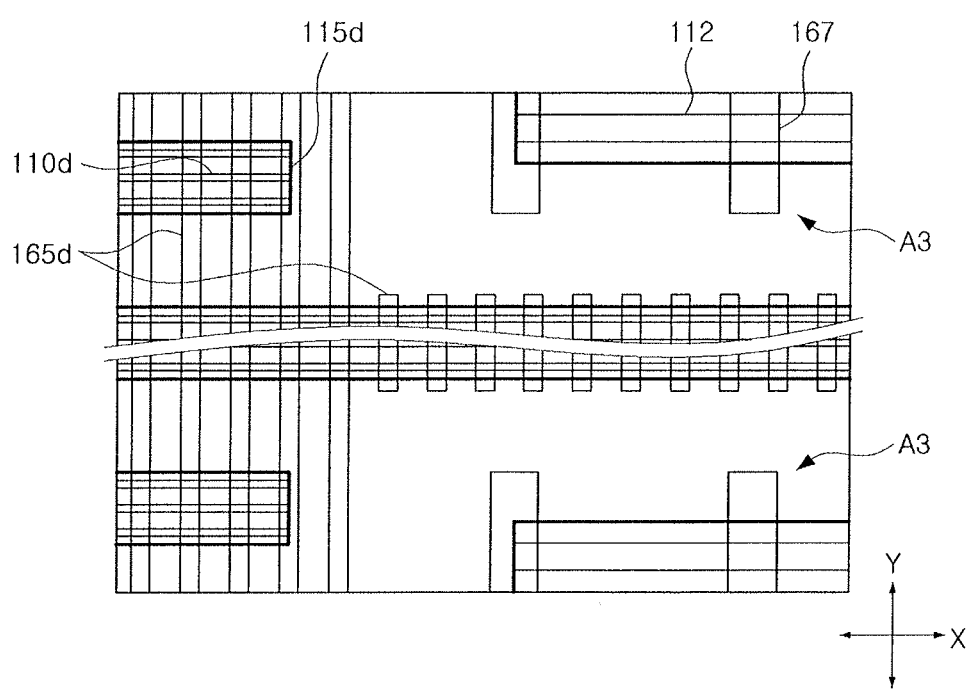
FIG. 28 illustrates a plan view of a semiconductor device according to an example embodiment.

FIG. 28 is a plan view of a semiconductor device according to an example embodiment. FIG. 28 is a plan view illustrating portions of the first region A1 and the third region A3 described above with respect to FIG. 12.

Referring to FIGS. 12 and 28, a semiconductor device may include the first region A1 and the third region A3 as illustrated in FIG. 12. On a dummy region of the first region A1, dummy active regions 115d, dummy active fin patterns 110d disposed on the dummy active regions 115d, and dummy gate lines 165d spaced apart from the first circuit gate lines 165c, may be disposed.

On the third region A3, a third circuit active region 117, a third circuit active fin pattern 112 disposed on the third circuit active region 117 and intersecting the third circuit active region 117, and third circuit gate lines 167 disposed on the third circuit active region 117 and intersecting the third circuit active fin pattern 112, may be disposed. The third circuit active fin pattern 112 may have a linear shape extended in the first direction X. The third circuit gate lines 167 may have a linear shape extended in the second direction Y.

In an example, the third circuit gate lines 167 may be formed at a pitch different from a pitch of the first dummy gate lines 165d. For example, the third circuit gate lines 167 may have a width greater than the first dummy gate lines 165d. A distance between the third circuit gate lines 167 may be greater than a distance between the first dummy gate lines 165d.

In an example, the third circuit active fin pattern 112 may have a width different from that of the dummy active fin pattern 110d, for example, may have a greater width, but is not limited thereto. For example, the third circuit active fin pattern 112 may have the same width as that of the dummy active fin pattern 110d.

In an example, the third circuit active fin pattern 112 may not be aligned with the dummy active fin pattern 110d on a virtual straight line. For example, the third circuit gate lines 167 may not be aligned with the dummy gate lines 165d on a virtual straight line.

Figure 29:
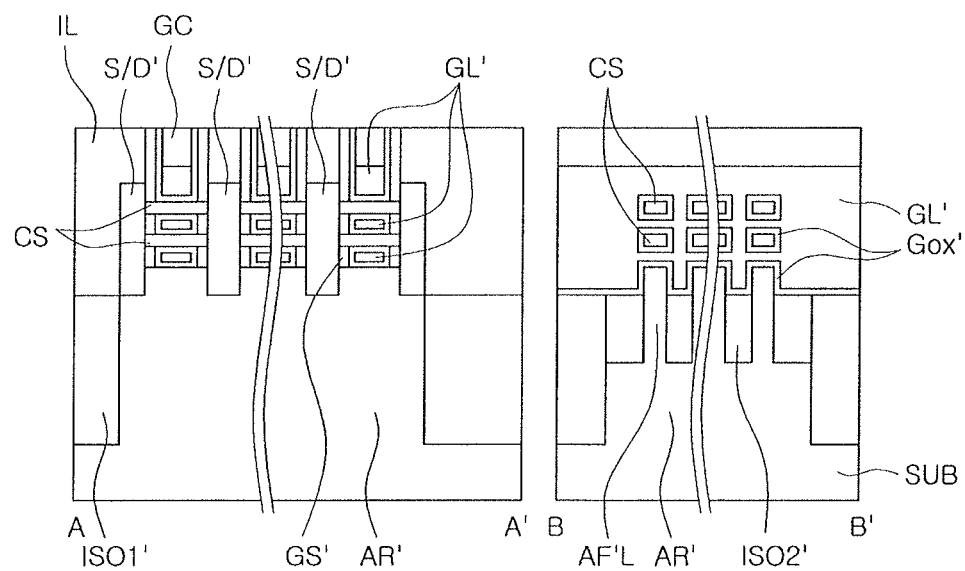
FIG. 29 illustrates a cross-sectional view of a semiconductor device according to an example embodiment.

A semiconductor device according to an example embodiment is described using patterns configuring transistors having a FinFET structure as described above with reference to FIGS. 13 and 14, for example, using the active region AR, the active fin patterns AFL, and the gate lines GL, but is not limited thereto. For example, a semiconductor device according to an example embodiment may be configured of patterns of transistors having a gate-all-around (GAA) structure. The patterns of the transistor having such a GAA structure will be described below with reference to FIG. 29. FIG. 29 is a cross-sectional view illustrating an example of patterns configuring a semiconductor device according to an example embodiment. In FIG. 29, a portion represented by A-A' may be a cross section to be perpendicular to a portion represented by B-B'. For example, in FIG. 29, a portion represented by B-B' may be a cross section obtained by cutting a middle portion of a portion represented by A-A'.

With reference to FIG. 29, a first isolation region ISO1' defining an active region AR' may be disposed on a substrate SUB. The substrate SUB may be a semiconductor substrate.

Active fin patterns AFL' may be disposed on the active region AR'. A second isolation region ISO2' may be disposed on sides of the active fin patterns AFL'.

Gate lines GL' intersecting the active fin patterns AFL' may be disposed. Source/drain regions S/D' may be disposed on the active fin patterns AFL' adjacent to the gate lines GL'. The source/drain regions S/D' may protrude upwardly from the active fin patterns AFL'.

Channel semiconductor layers CS disposed between the source/drain regions S/D' and connected thereto may be disposed. The channel semiconductor layers CS may be disposed on the active fin patterns AFL' and may be spaced apart therefrom. The gate lines GL' may be disposed to surround the channel semiconductor layers CS while intersecting the channel semiconductor layers CS. Thus, a transistor having a gate all around (GAA) structure may be provided.

In an example, the gate lines GL', the active fin patterns AFL', and the active region AR' described with reference to FIG. 29 may replace the gate lines, the active fin patterns, and the active region described above with reference to FIGS. 15 to 28.

Gate capping patterns GC may be disposed on the gate lines GL, and insulating spacers GS' may be disposed on sides of the gate lines GL. In addition, an insulating layer IL may be disposed on the first isolation region ISO1'.

Next, an example of a method of manufacturing a semiconductor device according to an example embodiment will be described with reference to FIGS. 30 to 35B.

In FIGS. 30 to 35B, FIGS. 30 and 32 are plan views illustrating an example of a method of manufacturing a semiconductor device according to an example embodiment, and FIGS. 31A, 31B, 33A, 33B, 34A, 34B, 35A and 35B are cross-sectional views illustrating an example of a method of manufacturing a semiconductor device according to an example embodiment. In FIGS. 31A, 31B, 33A, 33B, 34A, 34B, 35A, and 35B, FIGS. 31A, 33A, 34A and 35A are cross-sectional views illustrating a region taken along line of FIG. 16, and FIGS. 31B, 33B, 34B, and 35B are cross-sectional views illustrating a region taken along line IV-IV' of FIG. 16.

Figure 30:
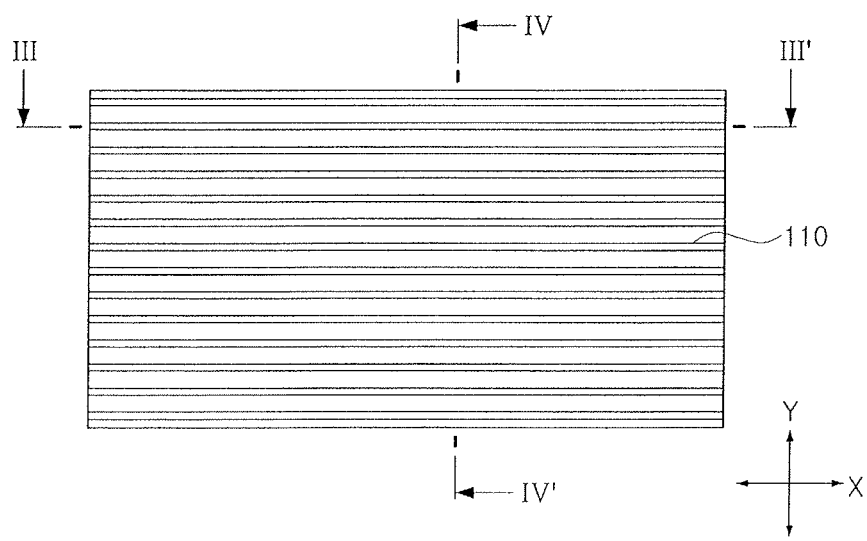
FIGS. 30 to 35B illustrate views of stages in a method of manufacturing a semiconductor device according to an example embodiment.
Figure 31A:
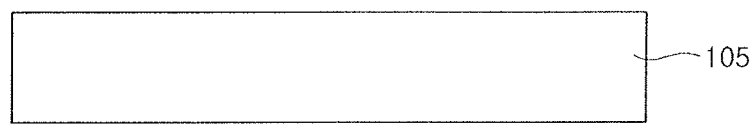
Figure 31B:
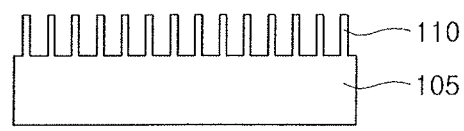
Figure 32:
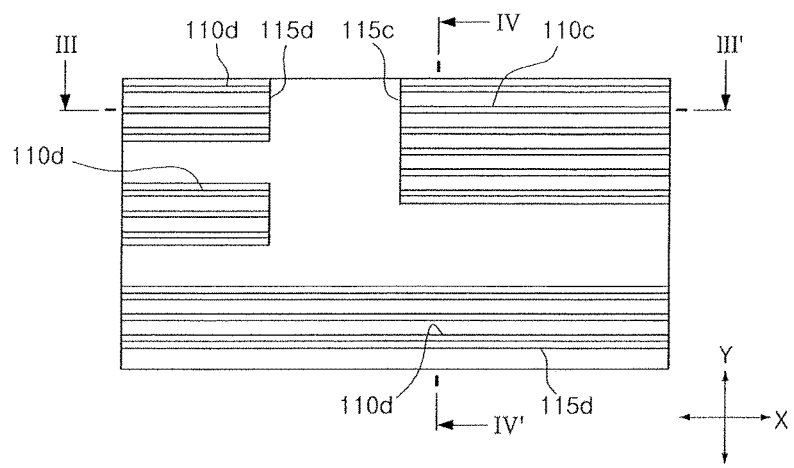

With reference to FIGS. 30, 31A and 31B, active fin lines 110 may be formed on a substrate 105. The substrate 105 may be a semiconductor substrate. The active fin lines 110 may be extended in a first direction X while being parallel to each other.

In an example, the active fin lines 110 may be formed using the active fin lines 4 described above with reference to FIG. 4A.

Figure 33A:
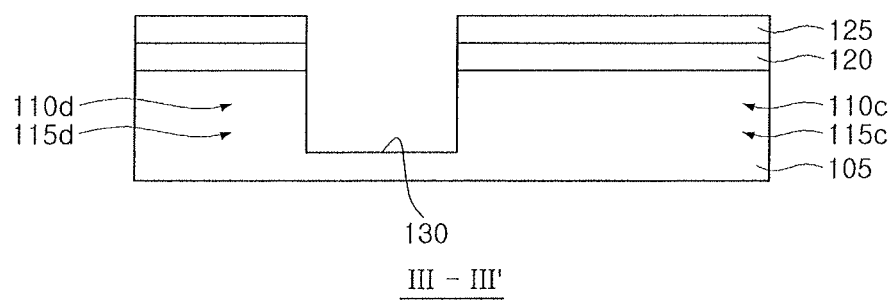
Figure 33B:
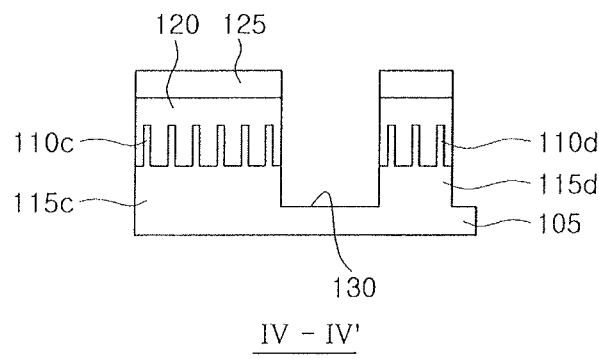

With reference to FIGS. 31, 33A and 33B, active regions may be formed on the substrate 105. The active regions may include circuit active regions 115c and dummy active regions 115d.

The formation of the active regions 115c and 115d may include forming a first insulating layer 120 on the substrate 105 including the active fin lines 110, forming a mask 125 on the first insulating layer 120, and forming a deep trench 130 by etching the first insulating layer 120 and the substrate 105 using the mask 125. The active regions 115c and 115d may be defined by the deep trench 130. The first insulating layer 120 may be formed of an insulating material such as silicon oxide or the like.

The active regions 115c and 115d may be formed using the active layout patterns 50 described above with reference to FIG. 6A. A flat shape of the active regions 115c and 115d may correspond to a flat shape of the active layout patterns 50 described above with reference to FIG. 6A.

Figure 34A:
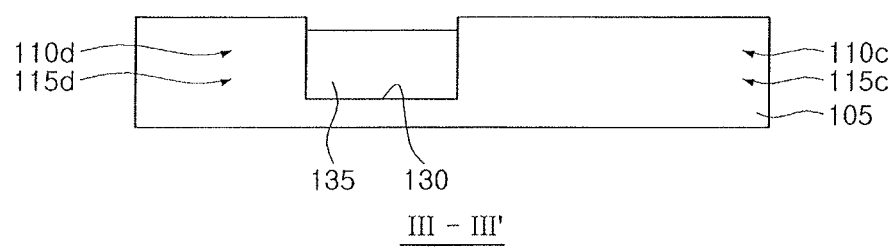
Figure 34B:
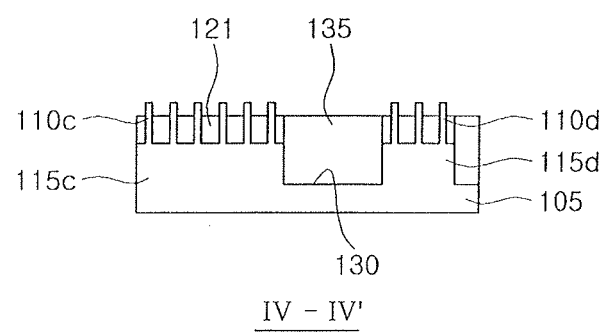

With reference to FIGS. 34A and 34B, a second insulating layer filling the deep trench 130 may be formed on the substrate 105 having the deep trench 130, the second insulating may be planarized, the mask 125 may be removed, and the second insulating layer and the first insulating layer 120 (FIGS. 33A and 33B) may be etched back, thereby forming a first isolation region 135 and a second isolation region 121. The first isolation region 135 may be formed by etching the second insulating layer, and the second isolation region 121 may be formed by etching the first insulating layer 120 (see FIGS. 33A and 33B).

The first isolation region 135 may define the active regions 115c and 115d, and the second isolation region 121 may be formed on sides of the active fin patterns 110c and 110d.

A level of upper surfaces of the active fin patterns 110c and 110d may be higher than a level of upper surfaces of the first and second isolation regions 135 and 121. Thus, side surfaces and upper surfaces of upper portions of the active fin patterns 110c and 110d may be exposed.

Figure 35A:
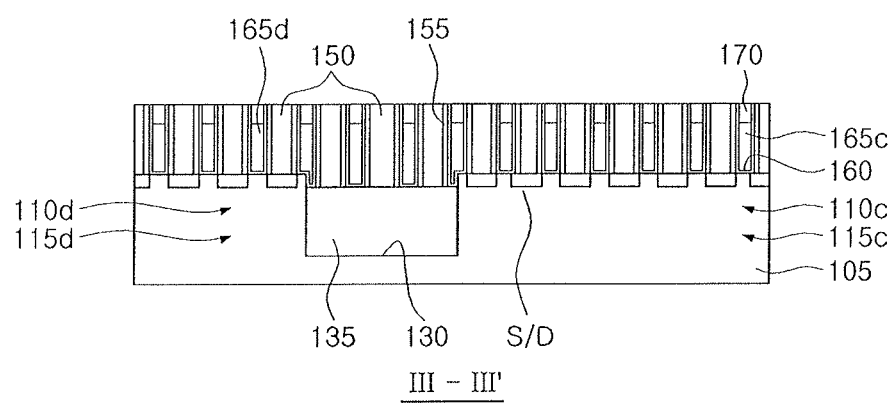
Figure 35B:
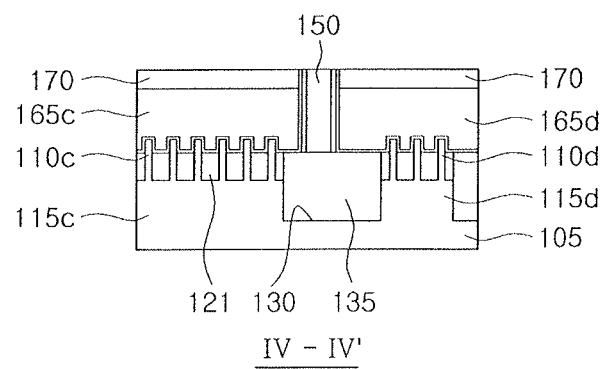

Referring to FIGS. 16, 35A and 35B, gate lines 165c and 165d may be formed on the substrate having the first and second isolation regions 135 and 121.

In an example, the formation of the gate lines 165c and 165d may include forming lines corresponding to the gate lines 7 described above with reference to FIG. 4B on the substrate having the active fin patterns 110c and 110d, and etching a portion of the lines using the gate layout pattern 60 described above with reference to FIG. 6B. Thus, the gate lines 165c and 165d may have a shape similar to that of the gate lines 165c and 165d described above with reference to FIG. 16.

In an example, the formation of the gate lines 165c and 165d may include forming insulating patterns 150 having gate trenches on the substrate having the first and second isolation regions 135 and 121, forming gate spacers 155 on sides of the insulating patterns 150, sequentially forming a gate dielectric portion 160 and a conducive material layer, planarizing and etching back the conductive material layer to partially fill the gate trench to form the gate lines 165c and 165d, and forming gate capping patterns 170 on the gate lines 165c and 165d.

As set forth above, according to example embodiments, a layout method for the formation of active fin patterns and gate lines may be provided. According to example embodiments, a layout method, in which a margin of a semiconductor process performed to form patterns in a circuit region and patterns in a dummy region may be improved, may be provided. According to example embodiments, a layout method, in which patterns formed in a dummy region may be formed more densely, may be provided. A layout method, in which patterns formed in a dummy region are disposed at a required density, or a distance between patterns formed in a dummy region and patterns formed in a circuit region may be appropriate therefor, may be provided. According to example embodiments, a semiconductor device manufactured using the layout method may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a circuit region and a dummy region adjacent to each other;
circuit active fin patterns in the circuit region and having a linear shape extended in a first direction;
dummy active fin patterns in the dummy region and having a linear shape extended in the first direction, the dummy active fin patterns including first-side fin patterns having end portions opposing end portions of the circuit active fin patterns;
circuit gate lines in the circuit region and intersecting the circuit active fin patterns; and
dummy gate lines in the dummy region and having end portions opposing end portions of the circuit gate lines,
wherein sides of the circuit active fin patterns and sides of the first-side fin patterns are aligned with each other, and
wherein sides of the circuit gate lines and sides of the dummy gate lines are aligned with each other.

2. The semiconductor device as claimed in claim 1, wherein:
the dummy region includes a first dummy region and a second dummy region located in the second direction of the circuit region,
the circuit region includes a first circuit region opposing the first dummy region and a second circuit region spaced apart from the first dummy region,
the first dummy region is between the second dummy region and the first circuit region, and
the dummy active fin patterns includes second-side fin patterns disposed in the first and second dummy regions.

3. The semiconductor device as claimed in claim 2, further comprising:
a circuit active region within the first circuit region;
a first dummy active region in the first dummy region; and
a second dummy active region in the second dummy region,
wherein the circuit active fin patterns are on the circuit active region, and
wherein the second-side fin patterns of the dummy active fin patterns are on the first and second dummy active regions.

4. The semiconductor device as claimed in claim 3, wherein the circuit active region has a width different from a width of the first dummy active region, and the second dummy active region has a width different from a width of the first dummy active region.

5. The semiconductor device as claimed in claim 4, wherein the first dummy active region includes portions having different widths, of which the number of the dummy active fin patterns disposed on a portion having a relatively great width, among the portions having different widths, is higher than the number of the dummy active fin patterns on a portion having a relatively narrow width.

6. A semiconductor device, comprising:
circuit active fin lines and circuit gate lines intersecting each other in a circuit active region;
dummy active fin lines and dummy gate lines intersecting each other in a dummy active region, the circuit active fin lines and the dummy active fin lines having same width and pitch, and the circuit gate lines and the dummy gate lines having same width and pitch,
wherein at least some of the dummy active fin lines are aligned with and collinear with respective circuit active fin lines, and at least some of the dummy gate lines are aligned with and collinear with respective circuit gate lines.

7. The semiconductor device as claimed in claim 6, wherein the at least some of the dummy active fin lines have end portions opposing end portions of the circuit active fin lines, and the at least some of the dummy gate lines have end portions opposing end portions of the circuit gate fin lines.

8. The semiconductor device as claimed in claim 7, wherein the at least some of the dummy active fin lines are disposed on virtual linear lines extended from the circuit active fin lines, and at least of the dummy gate fin lines are disposed on virtual linear lines extended from the circuit gate lines.

9. The semiconductor device as claimed in claim 6, further comprising a first space between some of the circuit active fin lines and dummy active fin lines, and a second space between some of the circuit gate lines and the dummy gate lines.

10. The semiconductor device as claimed in claim 6, wherein a density of the dummy active fin lines in the dummy active region is different from a density of the circuit active fin lines in the circuit active region.

* * * * *